(12) United States Patent
Kuo et al.

(10) Patent No.: US 12,527,047 B2
(45) Date of Patent: Jan. 13, 2026

(54) ISOLATION STRUCTURE FOR TRANSISTORS

(71) Applicant: Taiwan Semiconductor Manufacturing Company, Ltd., Hsinchu (TW)

(72) Inventors: Tai-Jung Kuo, Hsinchu (TW); Zhen-Cheng Wu, Taichung (TW); Chung-Ting Ko, Hsinchu (TW); Sung-En Lin, Hsinchu (TW); Chi On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 613 days.

(21) Appl. No.: 17/750,876

(22) Filed: May 23, 2022

(65) Prior Publication Data
US 2023/0268384 A1     Aug. 24, 2023

Related U.S. Application Data

(60) Provisional application No. 63/313,599, filed on Feb. 24, 2022.

(51) Int. Cl.
  *H10D 62/10*     (2025.01)
  *H10D 30/01*     (2025.01)
  (Continued)

(52) U.S. Cl.
  CPC ......... *H10D 62/115* (2025.01); *H10D 30/024* (2025.01); *H10D 30/62* (2025.01); *H10D 64/017* (2025.01); *H10D 30/6735* (2025.01)

(58) Field of Classification Search
  CPC ..... H01L 21/823431; H01L 21/823821; H01L 21/823481; H01L 27/0886; H01L 29/0673;
  (Continued)

(56) References Cited

U.S. PATENT DOCUMENTS

| 10,236,213 B1* | 3/2019 | Pandey | ............... H10D 30/024 |
| 2017/0025511 A1* | 1/2017 | Lee | ................ H01L 21/823431 |

(Continued)

FOREIGN PATENT DOCUMENTS

| KR | 20210024405 A | 3/2021 |
| KR | 20210098818 A | 8/2021 |

(Continued)

*Primary Examiner* — Eric A. Ward
(74) *Attorney, Agent, or Firm* — HAYNES AND BOONE, LLP

(57) ABSTRACT

A semiconductor structure according to the present disclosure includes a base fin over a substrate, a stack of nanostructures disposed directly over the base fin, a gate structure wrapping around each of the stack of nanostructures, an isolation feature disposed over the substrate and adjacent the base fin, and a dielectric fin disposed directly on the isolation feature. The dielectric fin includes in a bottom portion, a middle layer over the bottom portion and a top layer over the middle layer. The bottom portion includes an outer layer and an inner layer spaced apart from the gate structure and the isolation feature by the outer layer. The middle layer is in direct contact with top surfaces of the inner layer and the outer layer. The dielectric constant of the top layer of the dielectric fin is greater than the dielectric constant of the middle layer.

20 Claims, 34 Drawing Sheets

(51) Int. Cl.
*H10D 30/62* (2025.01)
*H10D 30/67* (2025.01)
*H10D 64/01* (2025.01)

(58) Field of Classification Search
CPC ....... H01L 29/42392; H01L 29/66795–66818; H01L 29/785–7856; H01L 29/7857; H01L 29/7858; H01L 29/78696
See application file for complete search history.

(56) References Cited

U.S. PATENT DOCUMENTS

| | | | |
|---|---|---|---|
| 2018/0308759 A1* | 10/2018 | Zang | H01L 21/823437 |
| 2019/0348414 A1* | 11/2019 | Hong | H10D 64/017 |
| 2020/0227323 A1* | 7/2020 | Zang | H10D 84/038 |
| 2020/0328208 A1* | 10/2020 | Chiang | H01L 29/785 |
| 2022/0045051 A1 | 2/2022 | You et al. | |
| 2022/0254650 A1* | 8/2022 | Choi | H01L 27/0924 |
| 2022/0302109 A1* | 9/2022 | Kim | H10D 84/83 |
| 2022/0344329 A1* | 10/2022 | Seo | H01L 29/41791 |
| 2023/0139399 A1* | 5/2023 | Zhou | H10D 62/118 |
| | | | 257/506 |

FOREIGN PATENT DOCUMENTS

| | | |
|---|---|---|
| KR | 20210147861 A | 12/2021 |
| KR | 20220008216 A | 1/2022 |
| KR | 20220015923 A | 2/2022 |
| KR | 20220019606 A | 2/2022 |
| TW | 202119588 A | 5/2021 |

* cited by examiner

ISOLATION STRUCTURE FOR TRANSISTORS

PRIORITY DATA

This application claims priority to U.S. Provisional Patent Application No. 63/313,599 filed on Feb. 24, 2022, the entirety of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor.

Dielectric isolation structures are used to isolate IC device features that would otherwise come in contact with one another. For example, dielectric fins are used to isolate source/drain features that are epitaxially grown from channel members of multi-gate devices, such as MBC transistors. Without dielectric fins, adjacent source/drain features may merge, resulting in undesirable electrical connections. While existing dielectric isolation structures are adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
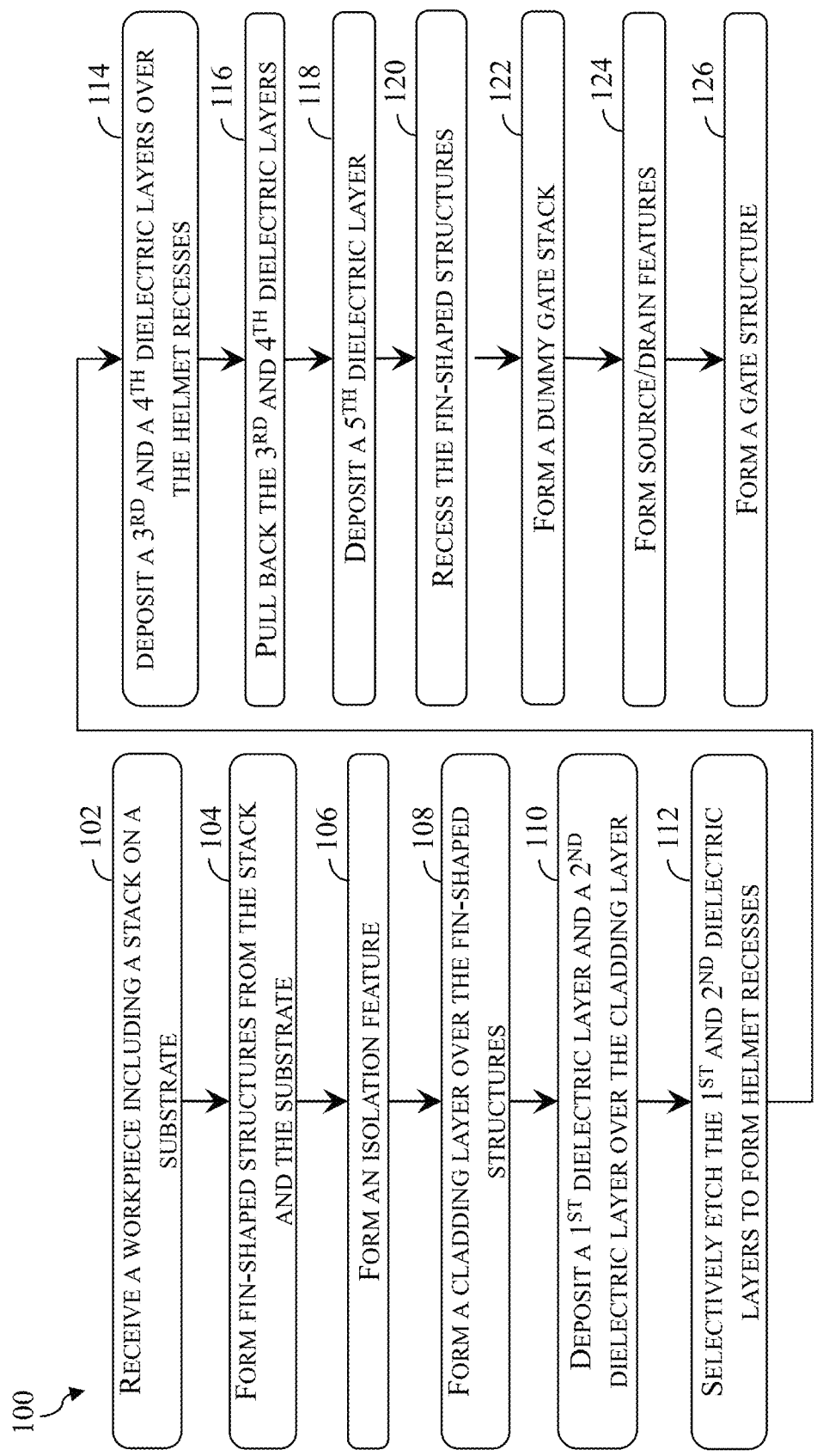
FIG. 1 illustrates a flowchart of a method 100 for forming a semiconductor structure, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to dielectric isolation structures and more particularly to dielectric isolation structures between adjacent source/drain features.

Dielectric fins or hybrid fins are implemented in fabrication of MBC transistors to serve several functions. During source/drain feature formation, they function to prevent epitaxial features of adjacent MBC transistors from merging with one another, causing undesirable shorts. After gate formation, they may serve as a gate cut feature or a part of a gate cut feature to separate a gate structure into multiple segments. The present disclosure provides a dielectric fin that readily integrates with the fabrication of MBC transistors without bogging down the performance thereof. In some embodiments, the dielectric fins of the present disclosure includes a bottom portion, a middle layer over the bottom portion and a top layer over the middle layer. The bottom portion includes an inner layer and an outer layer. The top layer is formed of etch-resistant metal oxides while the middle layer and the inner layer are formed of low-dielectric-constant dielectric material. In some other embodiments, the dielectric fin includes a bottom portion and a helmet layer over the bottom portion. The bottom portion includes an inner layer and an outer layer. The outer layer and the helmet layer are formed of etch-resistant metal oxides while the inner layer is formed of low-dielectric-constant dielectric material. The present disclosure also provides methods of forming dielectric fins.

The various aspects of the present disclosure will now be described in more detail with reference to the figures. FIGS. 1 and 21 illustrate flowcharts of a method 100 and a method 300 of forming a semiconductor device. Methods 100 and 300 are merely examples and are not intended to limit the present disclosure to what is explicitly illustrated therein. Additional steps may be provided before, during and after methods 100 and 300, and some steps described can be replaced, eliminated, or moved around for additional embodiments of the methods. Not all steps are described herein in detail for reasons of simplicity. Method 100 is described below in conjunction with FIGS. 2-20, which illustrate fragmentary cross-sectional views of a workpiece 200 at different stages of fabrication according to embodiments of method 100. Method 300 is described below in conjunction with FIGS. 22-34, which illustrate fragmentary cross-sectional views of a workpiece 200 at different stages of fabrication according to embodiments of method 300. Because a semiconductor device or a semiconductor structure will be formed from the workpiece 200, the workpiece 200 may be referred to as a semiconductor device 200 or a semiconductor structure 200 as the context requires. Throughout FIGS. 2-20 and 22-34, the X direction, the Y direction, and the Z direction are perpendicular to one another and are used consistently. For example, the X direction in one figure is parallel to the X direction in a different figure. Additionally, throughout the present disclosure, like reference numerals are used to denote like features.

Figure 2:
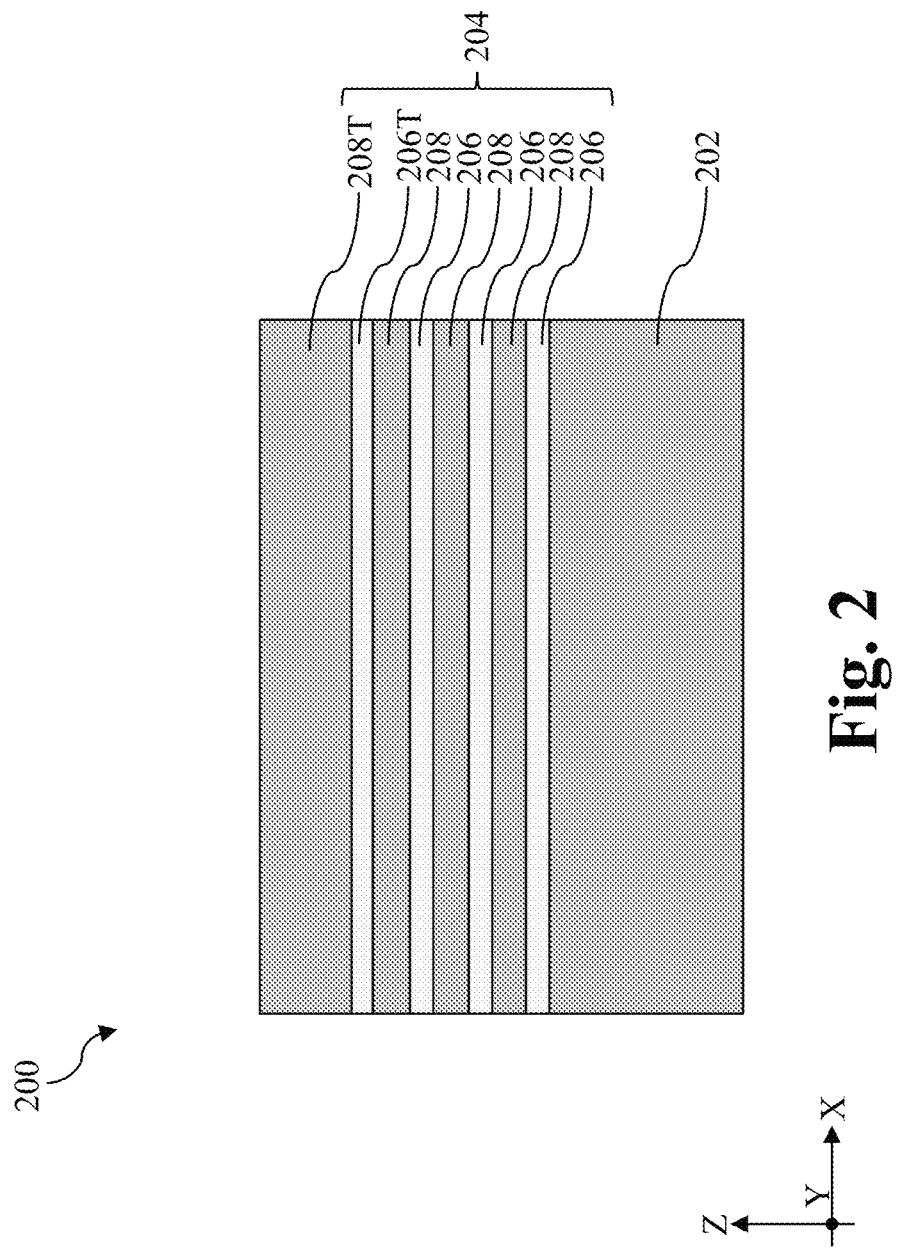
FIGS. 2-20 illustrate fragmentary cross-sectional views of a workpiece during various fabrication stages in the method 100 of FIG. 1, according to one or more aspects of the present disclosure.

Referring to FIGS. 1 and 2, method 100 includes a block 102 where a workpiece 200 is received. As shown in FIG. 2, the workpiece 200 includes a substrate 202 and a stack 204 disposed on the substrate 202. In one embodiment, the substrate 202 may be a silicon (Si) substrate. In some other embodiments, the substrate 202 may include other semiconductor materials such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a buried oxide (BOX) layer, to have a silicon-on-insulator (SOI) structure or a germanium-on-insulator (GeOI) structure. In some embodiments, the substrate 202 may include one or more well regions, such as n-type well regions doped with an n-type dopant (i.e., phosphorus (P) or arsenic (As)) or p-type well regions doped with a p-type dopant (i.e., boron (B)), for forming different types of devices. The doping the n-type wells and the p-type wells may be formed using ion implantation or thermal diffusion.

Referring still to FIG. 2, the stack 204 may include a plurality of channel layers 208 interleaved by a plurality of sacrificial layers 206. The channel layers 208 and the sacrificial layers 206 may have different semiconductor compositions. In some implementations, the channel layers 208 are formed of silicon (Si) and sacrificial layers 206 are formed of silicon germanium (SiGe). In these implementations, the additional germanium content in the sacrificial layers 206 allow selective removal or recess of the sacrificial layers 206 without substantial damages to the channel layers 208. In some embodiments, the sacrificial layers 206 and channel layers 208 may be deposited using an epitaxial process. The stack 204 may be epitaxially deposited using CVD deposition techniques (e.g., vapor-phase epitaxy (VPE) and/or ultra-high vacuum CVD (UHV-CVD)), molecular beam epitaxy (MBE), and/or other suitable processes. The sacrificial layers 206 and the channel layers 208 are deposited alternatingly, one-after-another, to form the stack 204. In the depicted embodiment, the stack 204 may further include a top channel layer 208T and a top sacrificial layer 206T to protect the rest of the stack 204 below and may be completely removed in a subsequent process. In some instances not explicitly shown in the figures, at least one of the top channel layer 208T and the top sacrificial layer 206T is omitted. When the top channel layer 208T and the top sacrificial layer 206T are discounted, the stack 204 shown in FIG. 2 includes three (3) layers of the sacrificial layers 206 and three (3) layers of channel layers 208, which is for illustrative purposes only and not intended to be limiting beyond what is specifically recited in the claims. The number of layers in the stack 204 depends on the desired number of channels members for the semiconductor device 200 and subsequent processes. In some embodiments, the number of the channel layers 208 (the top channel layer 208T excluded) in the stack 204 is between 2 and 10.

Figure 3:
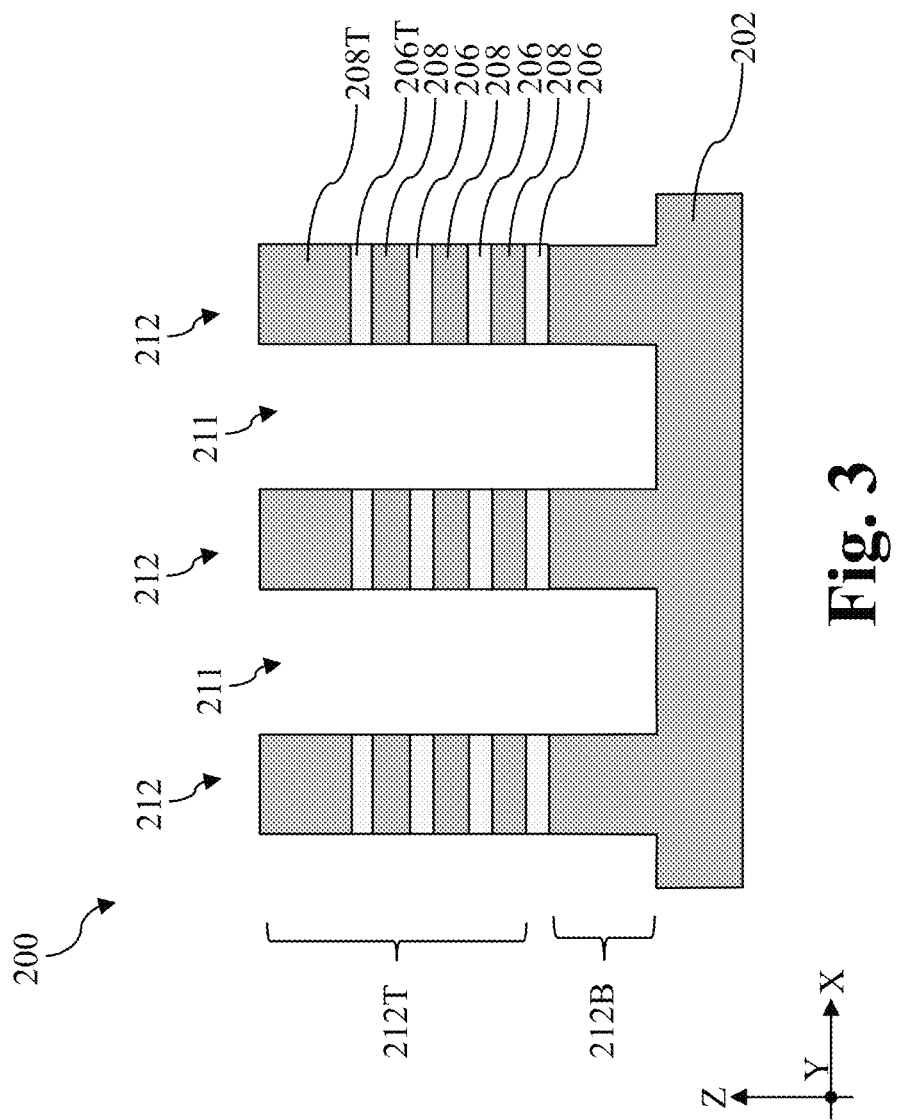

Referring to FIGS. 1 and 3, method 100 includes a block 104 where fin-shaped structure 212 are formed. In some embodiments, at block 104, the stack 204 and a portion of the substrate 202 are patterned to form the fin-shaped structures 212 that are defined by trenches 211. As shown in FIG. 3, each of the fin-shaped structures 212 includes a base portion 212B formed from a portion of the substrate 202 and a top portion 212T formed from the stack 204. The top portion 212T is disposed over the base portion 212B. In other words, the trenches 211 extend completely through the stack 204 and at least partially into the substrate 202. The fin-shaped structures 212 extend lengthwise along the Y direction and extend vertically along the Z direction from the substrate 202. The fin-shaped structures 212 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. Photolithography processes, as used herein, may include use of radiation sources such as a deep-ultraviolet (DUV) excimer lasers, krypton-fluoride (KrF) lasers, argon-fluoride (ArF) lasers, or an extreme-ultraviolet (EUV) light source. In an example photolithography process, a hard mask layer is first deposited over the stack 204 and then a material layer is formed over the hard mask. The material layer is patterned using a photolithography process. Spacers are formed alongside the patterned material layer using a self-aligned process. The material layer is then removed, and the remaining spacers, or mandrels, may then be used to pattern the hard mask layer and then the patterned hard mask layer may be used to pattern the fin-shaped structures 212 by etching the stack 204 and the substrate 202. The etching process can include dry etching, wet etching, reactive ion etching (RIE), and/or other suitable processes. While not explicitly shown in FIG. 3, a semiconductor liner may be deposited over surfaces of the fin-shaped structure 212 and the substrate 202. The semiconductor liner may include silicon (Si) or silicon-rich silicon germanium (SiGe). In some implementations, the semiconductor liner may be deposited using ALD, PEALD, VPE, MBE, or a suitable method.

Figure 4:
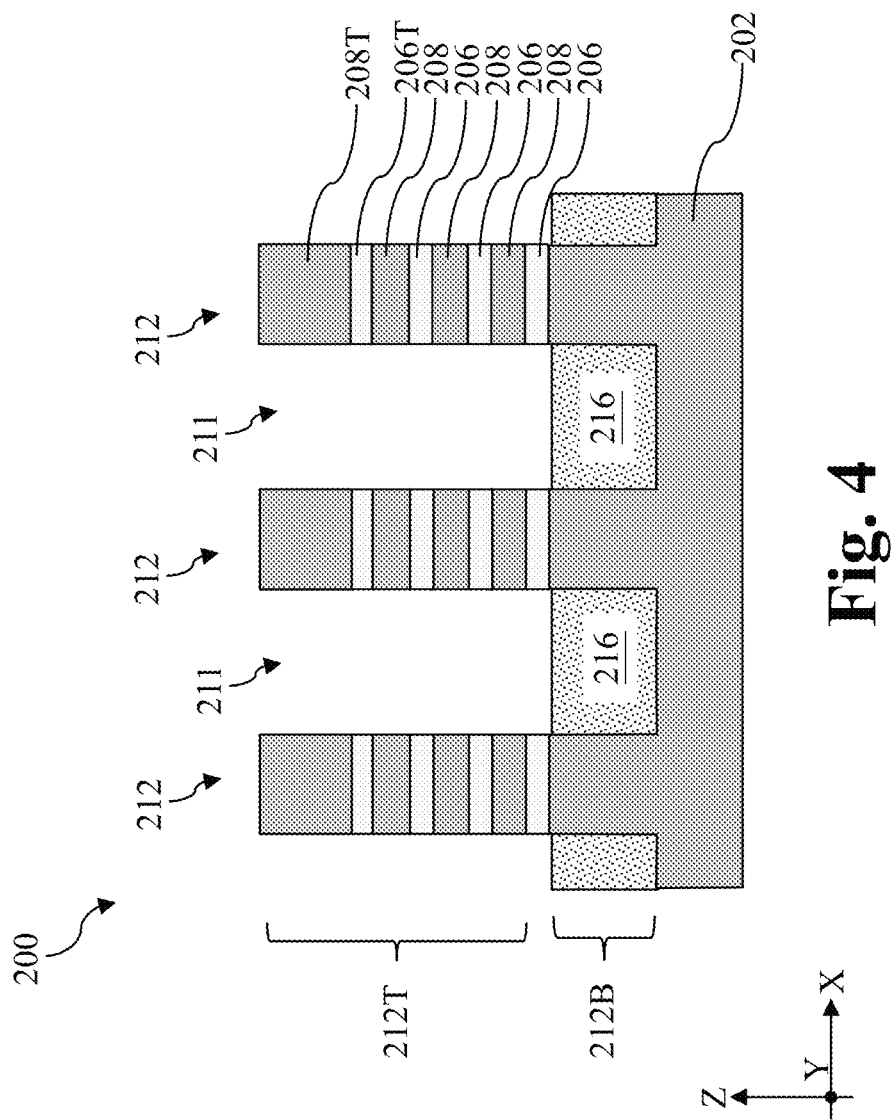

Referring to FIGS. 1 and 4, method 100 includes a block 106 where an isolation feature 216 is formed. After the fin-shaped structures 212 are formed, the isolation feature 216 shown in FIG. 4 is formed between neighboring fin-shaped structures 212. The isolation feature 216 may also be referred to as a shallow trench isolation (STI) feature 216. In an example process, a dielectric material for the isolation feature 216 is first deposited over the workpiece 200, filling the trenches 211 between fin-shaped structures 212 with the dielectric material. In some embodiments, the dielectric material may include silicon oxide, silicon oxynitride, fluorine-doped silicate glass (FSG), a low-k dielectric, combinations thereof, and/or other suitable materials. In various examples, the dielectric material may be deposited by a CVD process, a flowable CVD (FCVD) process, spin-on coating, and/or other suitable process. The deposited dielectric material is then thinned and planarized, for example by a chemical mechanical polishing (CMP) process, until at least a portion of the fin-shaped structures is exposed. The planarized dielectric material is further recessed by a dry etching process, a wet etching process, and/or a combination thereof to form the isolation feature 216. When the semiconductor liner is formed, the recessing removes of the semiconductor liner over surfaces of the fin-shaped structures 212 rising above the isolation feature 216. As shown in FIG. 4, the top portions 212T of the fin-shaped structures 212 rise above the isolation feature 216 while the base portions 212B are surrounded by the isolation feature 216.

Figure 5:
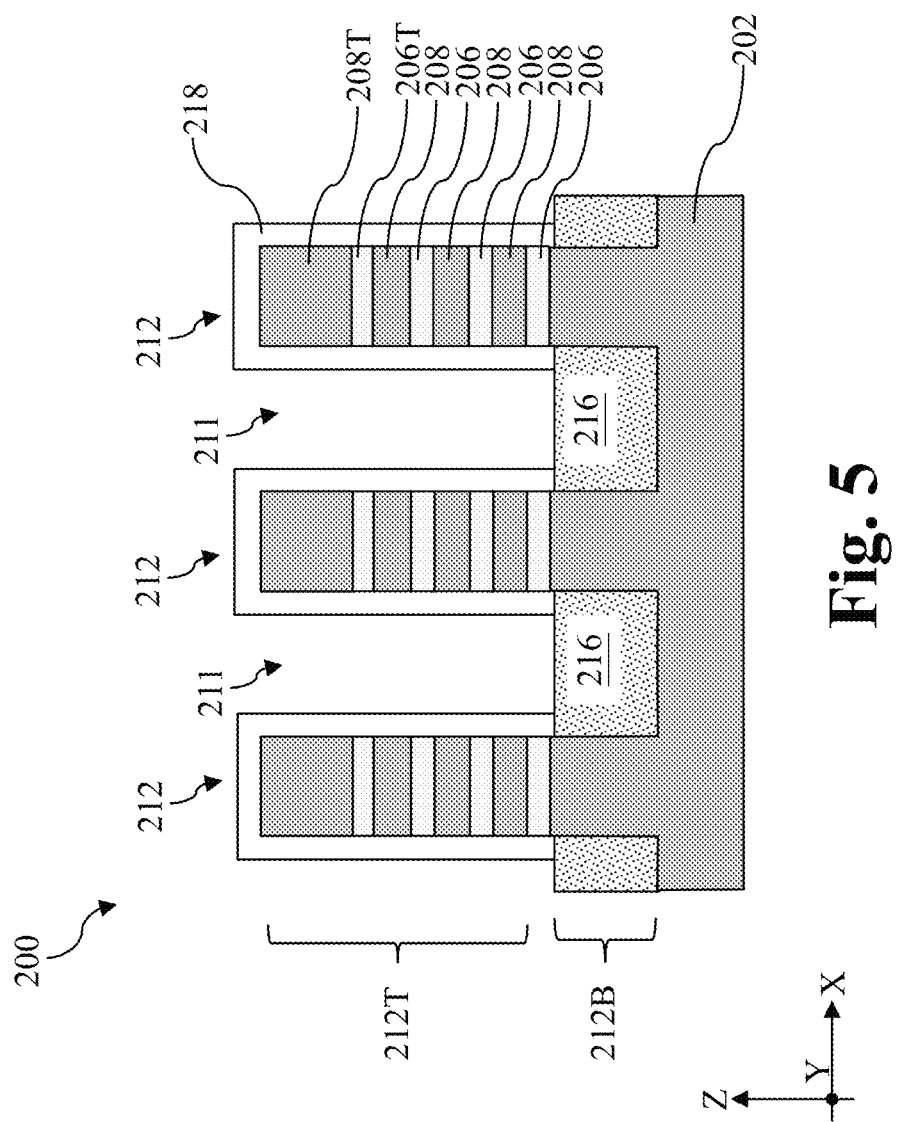

Referring to FIGS. 1 and 5, method 100 includes a block 108 where a cladding layer 218 is formed over the fin-shaped structures 212. In some embodiments, the cladding layer 218 may have a composition similar to that of the sacrificial layers 206. In one example, the cladding layer 218 may be formed of silicon germanium (SiGe). This common composition between the sacrificial layers 206 and the cladding layer 218 allows selective and simultaneous recess or removal of the sacrificial layers 206 and the cladding layer 218 in a subsequent process. In some embodiments, the cladding layer 218 may be epitaxially deposited using vapor phase epitaxy (VPE) or molecular beam epitaxy (MBE). As shown in FIG. 5, the cladding layer 218 is selectively disposed on exposed surfaces of the fin-shaped structures 212, but not on the isolation feature 216, which is formed of a dielectric material. In some instances, the cladding layer 218 may have a thickness between about 2 nm and about 20 nm. After the deposition of the cladding layer 218, a portion of the isolation feature 216 is exposed in the trenches 211, now made narrower by the cladding layer 218.

Figure 6:
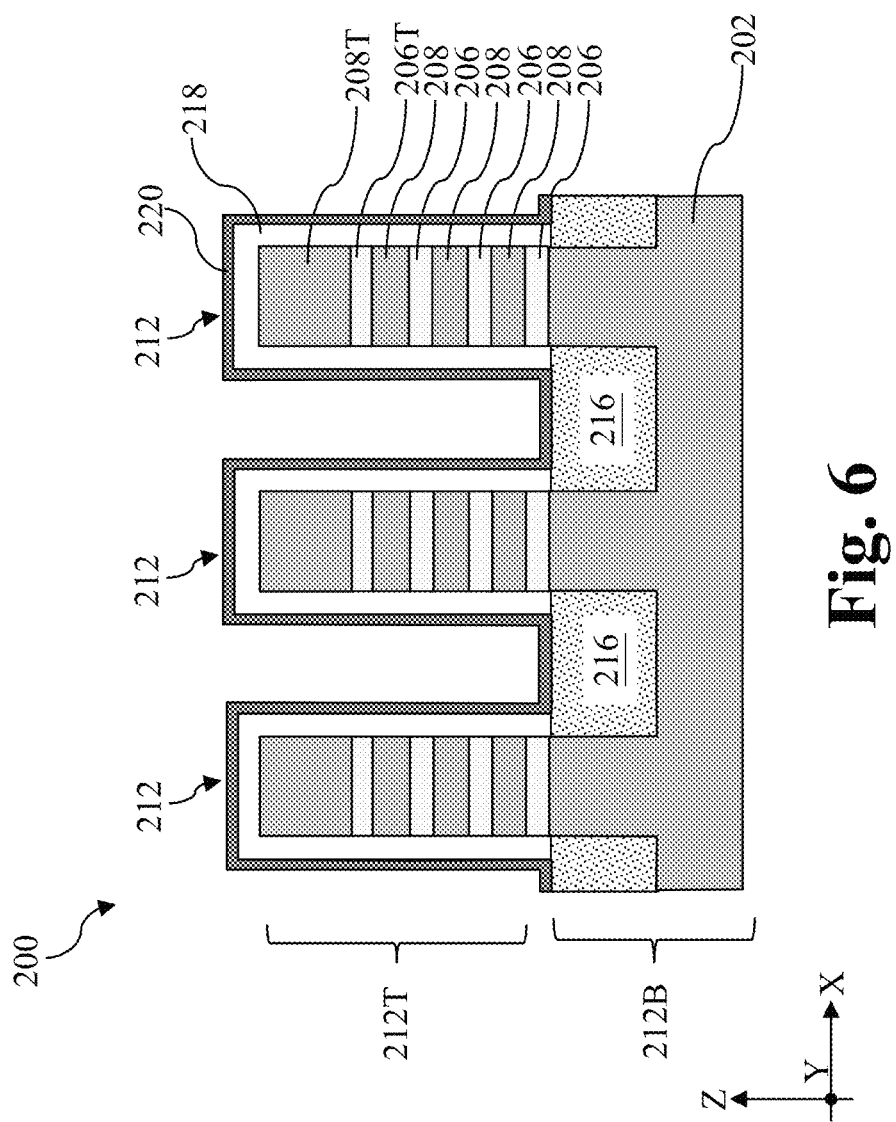
Figure 7:
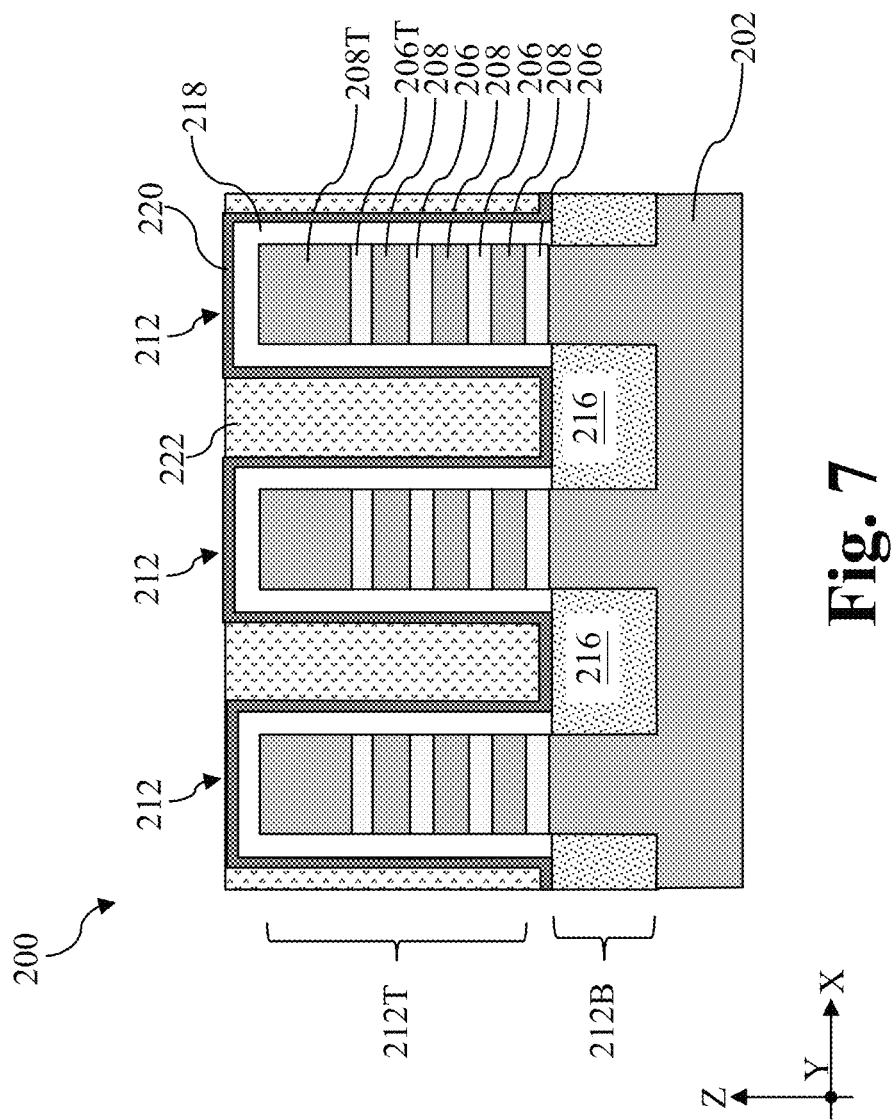

Referring to FIGS. 1, 6 and 7, method 100 includes a block 110 where a first dielectric layer 220 and a second dielectric layer 222 are deposited over the workpiece 200, including over the cladding layer 218 and trenches 211. In an example process, the first dielectric layer 220 is conformally deposited over the workpiece 200, including in the trenches 211, as shown in FIG. 6. The first dielectric layer 220 may be deposited using PECVD, ALD, or a suitable method. The first dielectric layer 220 lines the sidewalls and the bottom surfaces of the trenches 211, which is defined by the cladding layer 218 before the operations at block 110. The first dielectric layer 220 may also be referred to as a dielectric liner 220 or an outer layer 220. In some embodiments, the first dielectric layer 220 is formed to a thickness between about 2 nm and about 15 nm. Referring to FIG. 7, a second dielectric layer 222 is then deposited over the first dielectric layer 220 on the workpiece 200 using CVD, SACVD, FCVD, ALD, spin-on coating, and/or other suitable process. The second dielectric layer 222 may also be referred to as a dielectric filler 222 or an inner layer 222. The first dielectric layer 220 may include an oxygen-free dielectric material, such as silicon carbonitride, silicon carbide, or silicon nitride. In some other instances, the first dielectric layer 220 is at least not fully oxidized. The second dielectric layer 222 may include an oxygen-containing semiconductor oxide, such as silicon oxide, silica glass, or fluorine-doped silicon oxide, silicon oxide or other dielectric layers that are fully oxidized or are unlikely to be oxidized by an oxidizer. In the depicted embodiment, the second dielectric layer 222 is formed of silicon oxide. In the depicted embodiment, a dielectric constant of the first dielectric layer 220 is greater than a dielectric constant of the second dielectric layer 222.

While not explicitly illustrated, after the deposition of the first dielectric layer 220 and the second dielectric layer 222, the workpiece may be planarized using a chemical mechanical polishing (CMP) process until top surfaces of the top channel layer 208T, the cladding layer 218, the first dielectric layer 220, and the second dielectric layer 222 are coplanar.

Figure 8:
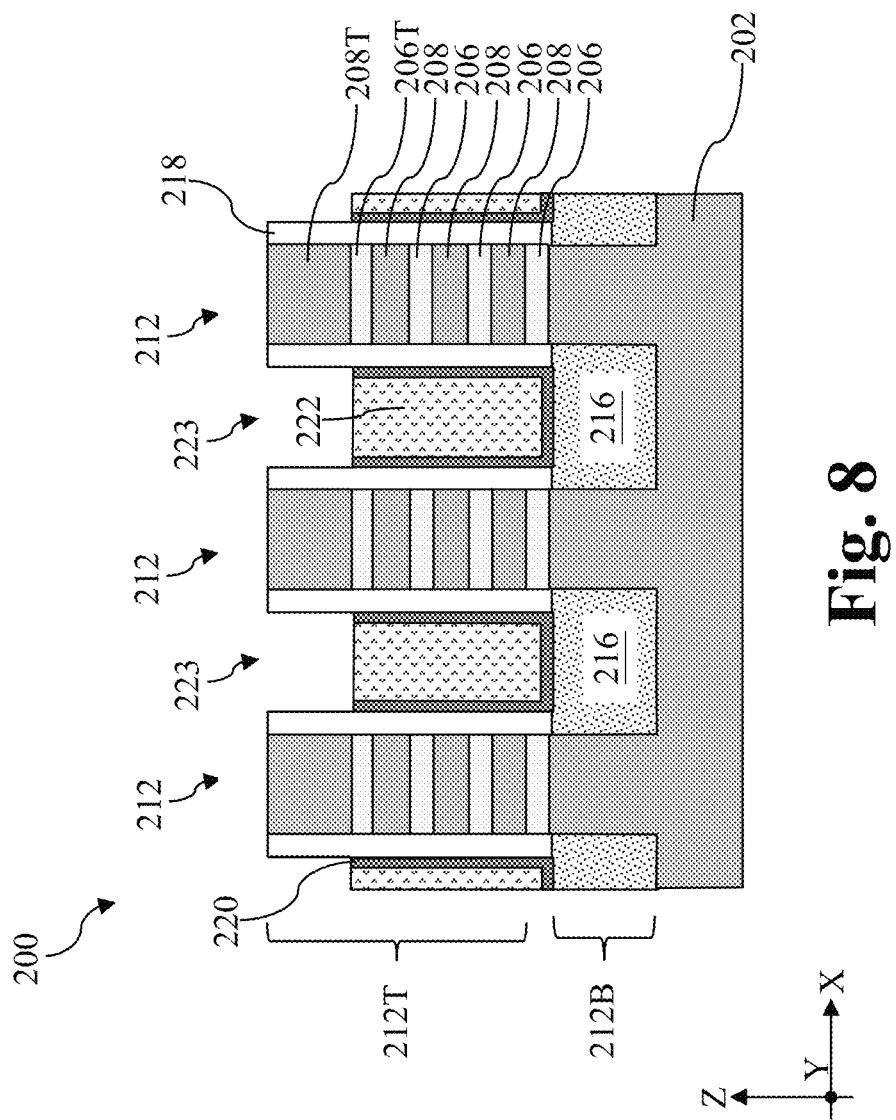

Referring to FIGS. 1 and 8, method 100 includes a block 112 where the first dielectric layer 220 and the second dielectric layer 222 are selectively etched back to form first helmet recesses 223. The etching process at block 112 is highly selective to the first dielectric layer 220 and the second dielectric layer 222, which are formed of dielectric materials, rather than semiconductor materials that form the fin-shaped structure 212. In some embodiments, the selective etching process at block 112 may include use of ammonia ($NH_3$) and hydrofluoric acid (HF). In an example process, the selective etching at block 112 includes multiple cycles of ammonia ($NH_3$) exposure and multiple cycles of hydrofluoric acid (HF) exposure. In some alternative embodiments, a separate dry etch process that uses nitrogen trifluoride ($NF_3$), argon (Ar), and oxygen ($O_2$) may be performed to etch the first dielectric layer. As shown in FIG. 8, because the etching process at block 112 is selective to the first dielectric layer 220 and the second dielectric layer 222, the top channel layer 208T and the cladding layer 218 are substantially unetched. At conclusion of operations at block 112, the first helmet recesses 223 are formed over the first dielectric layer 220 and the second dielectric layer 222 between two adjacent top portion 212T. After the etch back at block 112, the first dielectric layer 220 and the second dielectric layer 222 may be collectively referred to as a bottom portion. While not explicitly shown in the figures, in some alternative embodiments the etch back at block 112 may progress further toward the substrate 202 to form a deeper first helmet recesses 223. Such a deep first helmet recesses 223 may result in formation of thicker etch resistant dielectric materials to improve fabrication process window and process yield.

Figure 9:
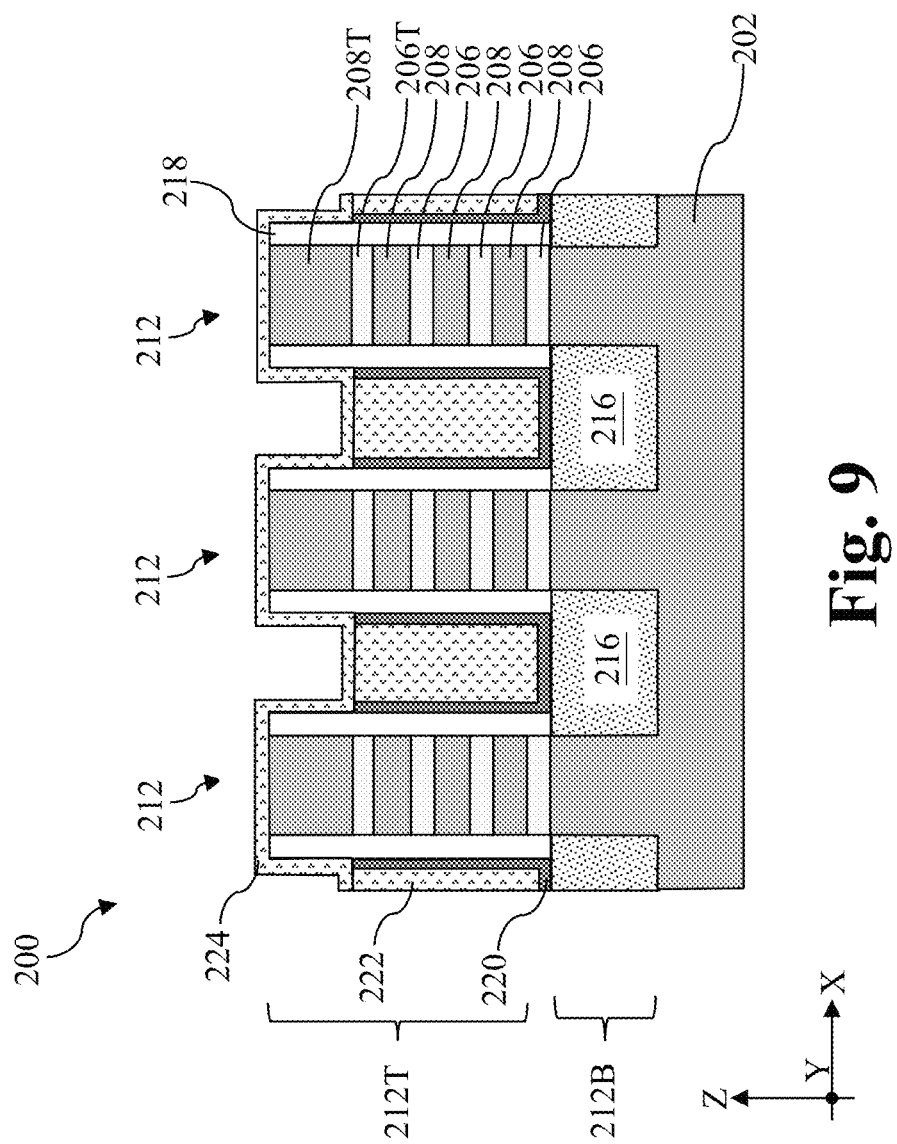
Figure 10:
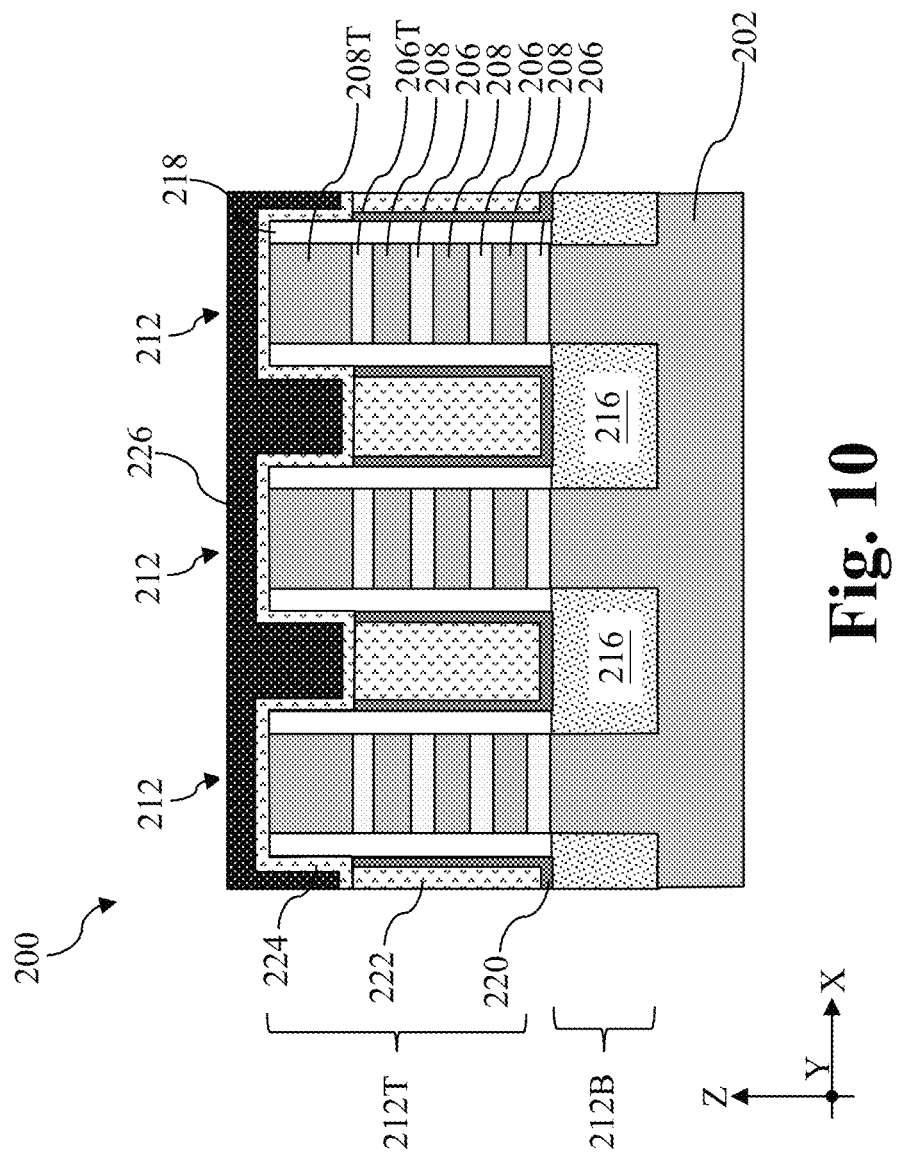

Referring to FIGS. 1, 9 and 10, method 100 includes a block 114 where a third dielectric layer 224 and the fourth dielectric layer 226 are deposited over the workpiece 200, including over the first helmet recesses 223. In an example process, the third dielectric layer 224 is conformally deposited over the workpiece 200, including in the first helmet recesses 223, as shown in FIG. 9. The third dielectric layer 224 may be deposited using PECVD, ALD, or a suitable method. The third dielectric layer 224 lines the sidewalls and the bottom surfaces of the first helmet recesses 223, which are defined by the cladding layer 218 along the X direction. The third dielectric layer 224 may also be referred to as a middle layer 224 or an intermediate layer 224 because it is position between the bottom portion (i.e., the first dielectric layer 220 and the second dielectric 222) and the more etch resistant fourth dielectric layer 226. In some embodiments, the third dielectric layer 224 is formed to a thickness between about 2 nm and about 15 nm. Referring then to FIG. 10, the fourth dielectric layer 226 is then deposited over the third dielectric layer 224 on the workpiece 200 using CVD, SACVD, FCVD, ALD, spin-on coating, and/or other suitable process. The fourth dielectric layer 226 may also be referred to as a helmet layer 226 or a top layer 226. The third dielectric layer 224 may include an oxygen-containing semiconductor oxide, such as silicon oxide, silica glass, or fluorine-doped silicon oxide, silicon oxide or other dielectric layers that are fully oxidized or are unlikely to be oxidized by an oxidizer. In the depicted embodiment, the third dielectric layer 224 is formed of silicon oxide. In the depicted embodiment, the fourth dielectric layer 226, is more etch resistant than the third dielectric layer 224, the second dielectric layer 222, or the first dielectric layer 220. The fourth dielectric layer 226 may include a metal oxide or a rare metal oxide, such as hafnium oxide, ruthenium oxide, lanthanum oxide, rhenium oxide, aluminum oxide, or zirconium oxide. In the depicted embodiment, a dielectric constant of the fourth dielectric layer 226 is greater than a dielectric constant of the second dielectric layer 222 or a dielectric constant of the third dielectric layer 224. In one embodiment, the first dielectric layer 220 includes silicon carbonitride or silicon carbide, the second dielectric layer 222 includes silicon oxide, the third dielectric layer 224 includes silicon oxide, and the fourth dielectric layer 226 includes hafnium oxide.

Figure 11:
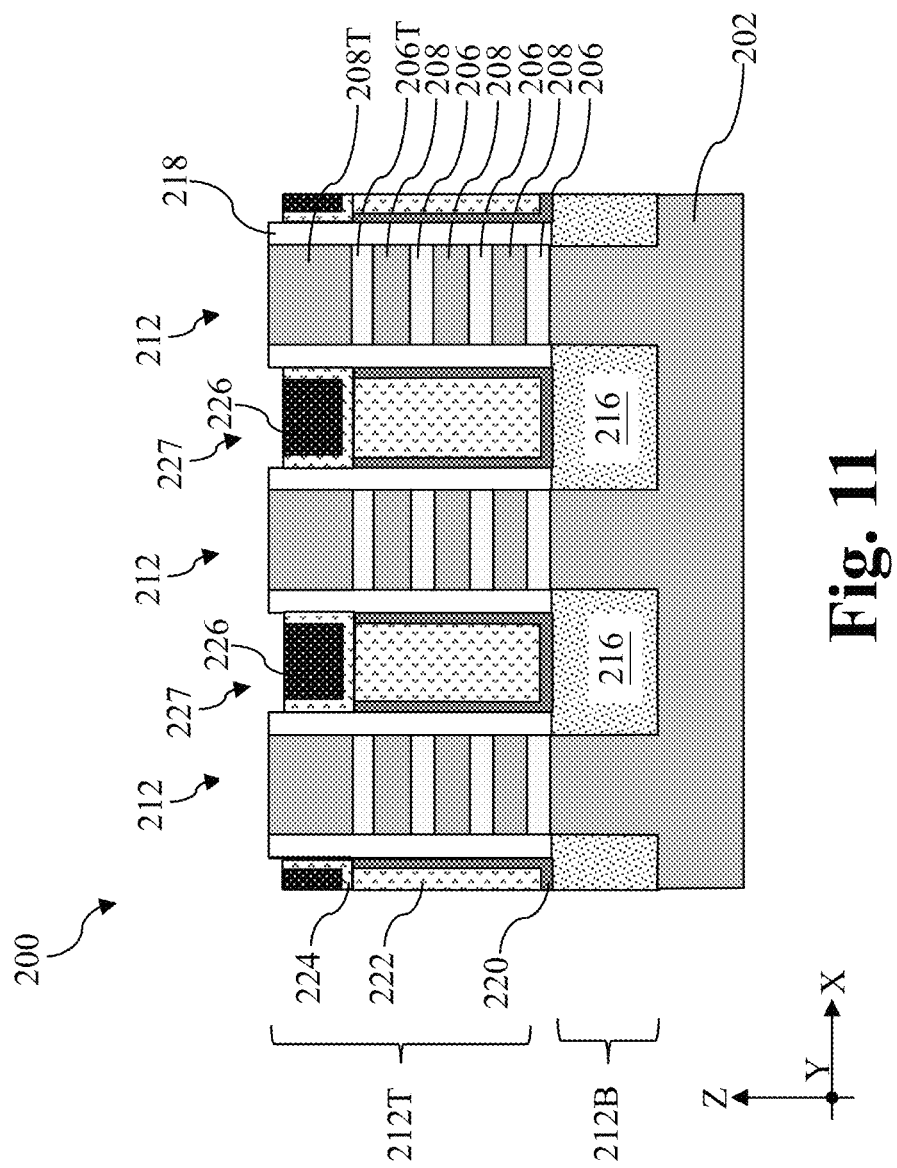

Referring to FIGS. 1 and 11, the method 100 may include a block 116 where the third dielectric layer 224 and the fourth dielectric layer 226 are selectively pulled back to form top recesses 227. In some embodiments, at block 116, the third dielectric layer 224 and the fourth dielectric layer 226 may be etched using a wet etch process that includes use of hydrochloric acid (HCl) and hydrofluoric acid (HF). In some implementations, water is used as a solvent. In some alternative implementations, a solvent less polar than water, such as ethylene glycol, may be used to balance the etch rates of the third dielectric layer 224 and the fourth dielectric layer 226. As shown in FIG. 11, the selective pull-back of the third dielectric layer 224 and the fourth dielectric layer 226 may form top recesses 227, where top surfaces of the third dielectric layer 224 and the fourth dielectric layer 226 are lower than top surfaces of the cladding layer 218 and the top channel layers 208T.

Figure 12:
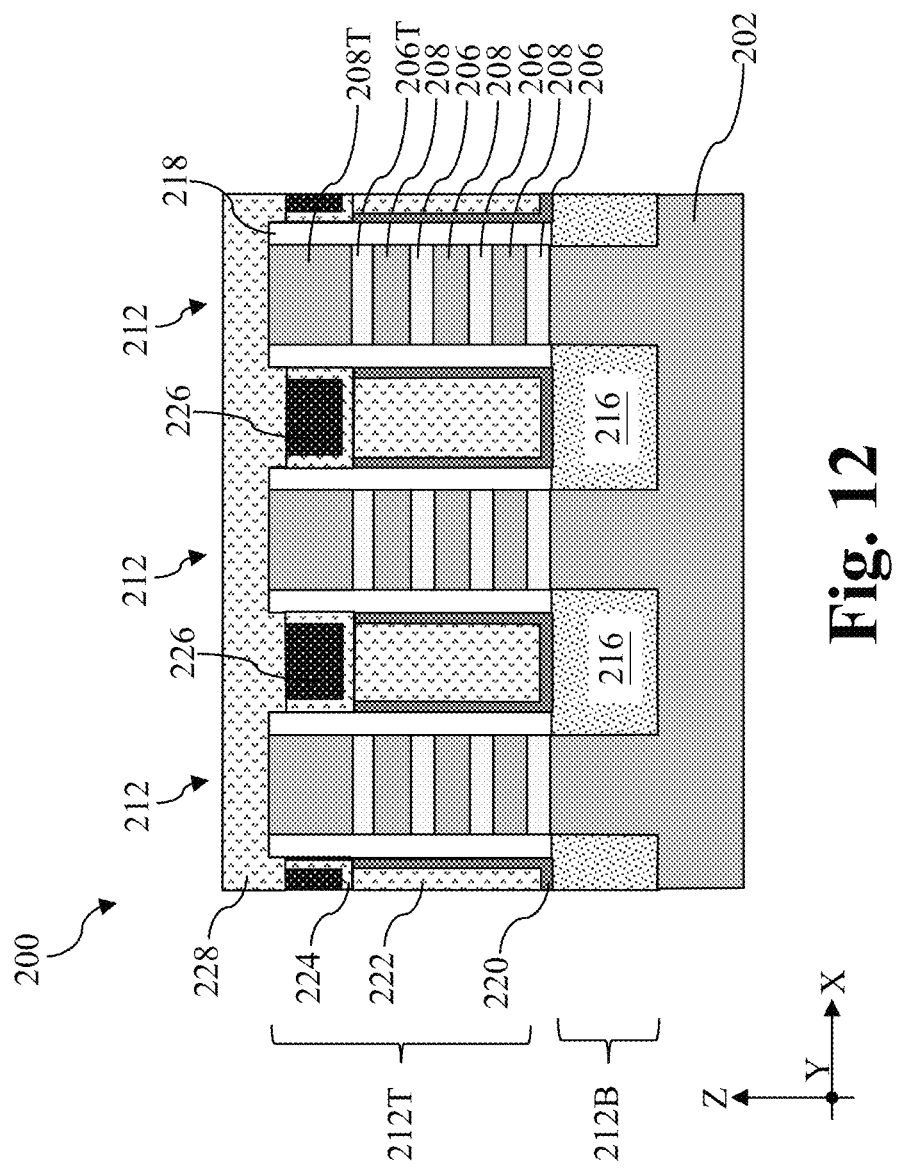

Referring to FIGS. 1 and 12, the method 100 may include a block 118 where a fifth dielectric layer 228 is deposited over the workpiece 200, including over the top recesses 227. At block 118, the fifth dielectric layer 228 may be deposited over the workpiece 200 using CVD, SACVD, FCVD, ALD, spin-on coating, and/or other suitable process. Like the second dielectric layer 222, the fifth dielectric layer 228 may include an oxygen-containing semiconductor oxide, such as silicon oxide, silica glass, or fluorine-doped silicon oxide, silicon oxide or other dielectric layers that are fully oxidized or are unlikely to be oxidized by an oxidizer.

Figure 13:
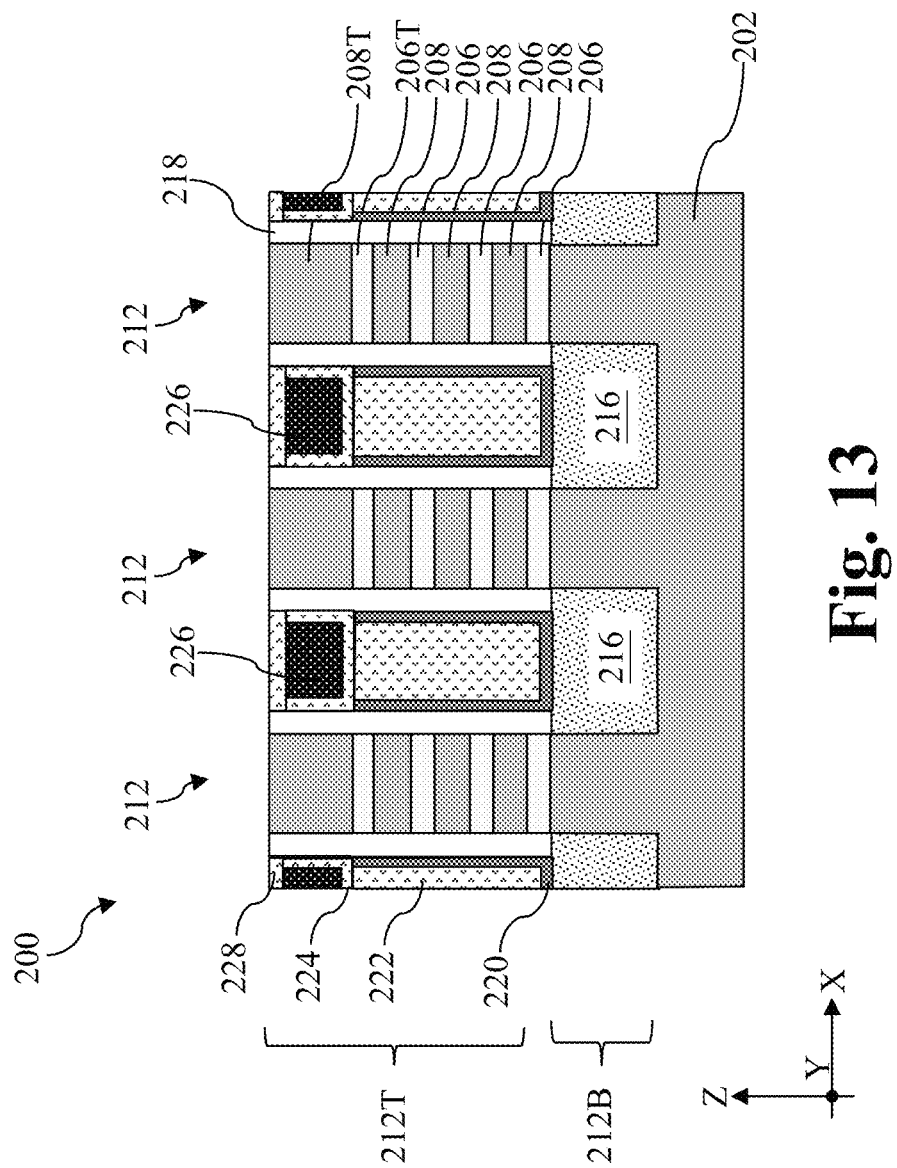
Figure 14:
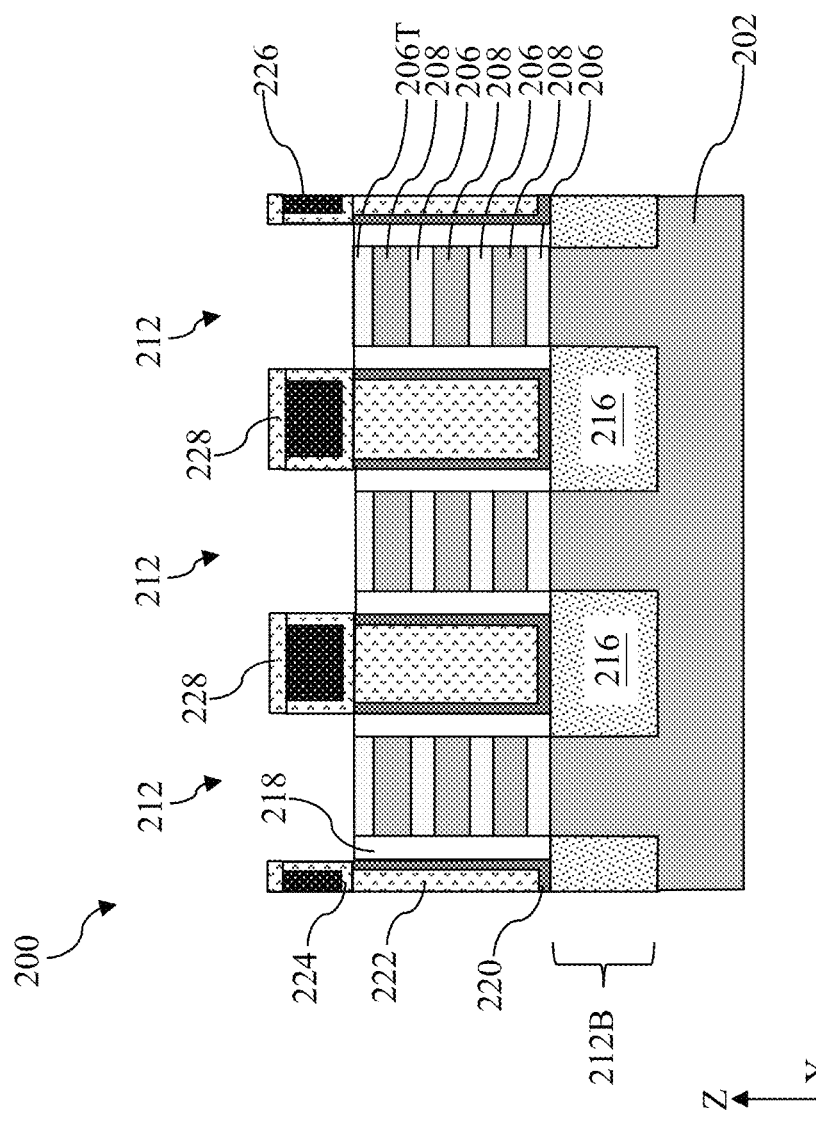

Referring to FIGS. 1, 13 and 14, method 100 includes a block 120 where the fin-shaped structures 212 are recessed. After the deposition of the fifth dielectric layer 228, the workpiece 200 is planarized using a chemical mechanical polishing (CMP) process to expose the fin-shaped structures 212, as shown in FIG. 13. With top surfaces of the fin-shaped structures 212 exposed, the top channel layer 208T, the top sacrificial layer 206T and a top portion of the cladding layer 218 are recessed. In some embodiments represented in FIG. 14, a top portion of the cladding layer 218 and the top channel layer 208T are selectively removed to expose the top sacrificial layer 206T of each of the fin-shaped structures 212. In some embodiments, the selective etch at block 120 may include use ammonium hydroxide, ozonated water (DI-$O_3$), and/or hydrofluoric acid (HF). Although not explicitly shown in the figures, a portion of the top sacrificial layer 206T may also be recessed by the etch process. In at least some embodiments, the top sacrificial layer 206T functions to protect the topmost channel layer 208 and is not breached through at block 120. It is noted that the selective etch at block 120 is mask-less and is self-aligned because the selective etch at block 120 etches dielectric features, such as the third dielectric layer 224, the fourth dielectric layer 226 and the fifth dielectric layer 228, at a much slower rate.

Figure 15:
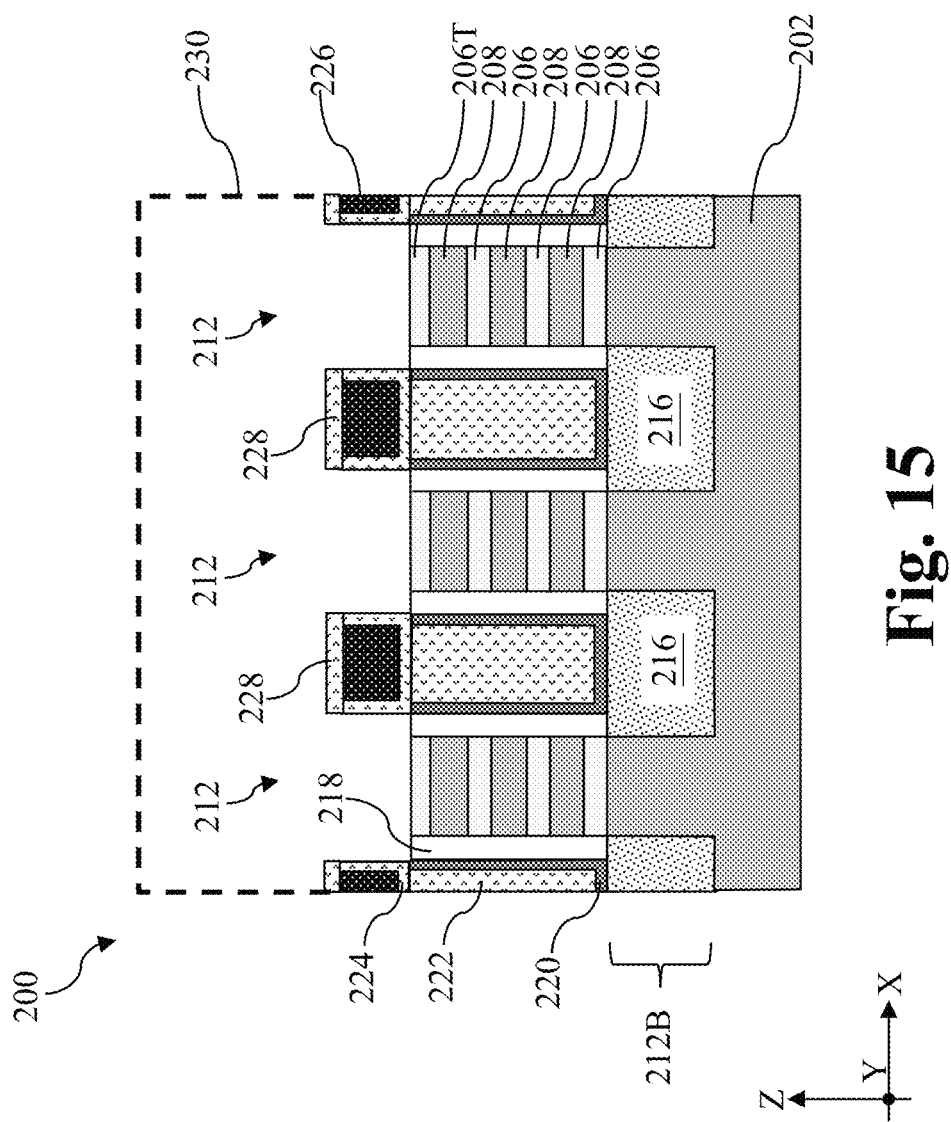
Figure 16:
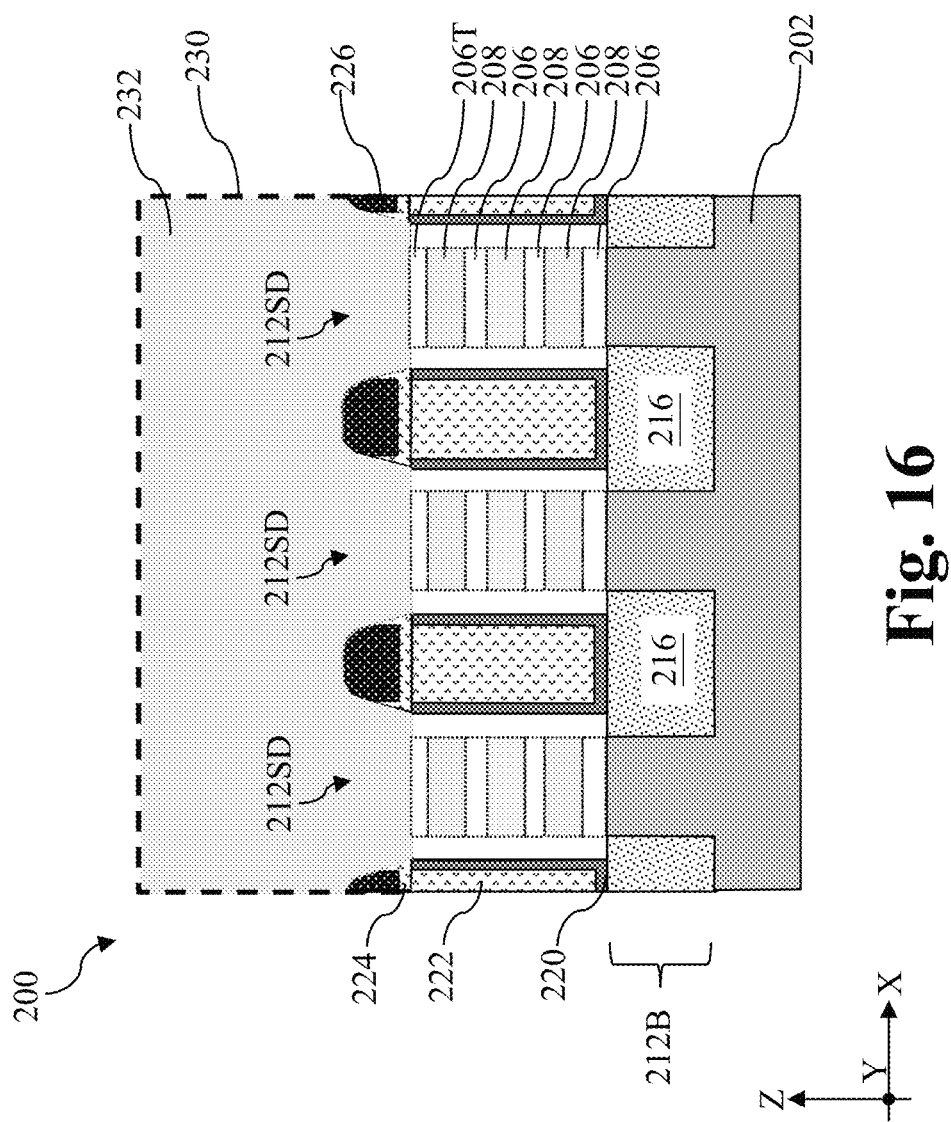

Referring to FIGS. 1, 15 and 16, method 100 includes a block 122 where a dummy gate stack 230 is formed over channel regions of the fin-shaped structures 212. In some embodiments, a gate replacement process (or gate-last process) is adopted where the dummy gate stack 230 serves as a placeholder for a functional gate structure that is formed at a later step. Other processes and configuration are possible. Although not explicitly shown in FIG. 15, the dummy gate stack 230 includes a dummy dielectric layer and a dummy electrode disposed over the dummy dielectric layer. The regions of the fin-shaped structures 212 underlying the dummy gate stack 230 may be referred to as channel regions. Each of the channel regions in a fin-shaped structure 212 is sandwiched along the Y direction between two source/drain regions for source/drain formation. In an example process, the dummy dielectric layer is blanketly deposited over the workpiece 200 by CVD. A material layer for the dummy electrode is then blanketly deposited over the dummy dielectric layer. The dummy dielectric layer and the material layer for the dummy electrode are then patterned using photolithography processes to form the dummy gate stack 230. In some embodiments, the dummy dielectric layer may include silicon oxide and the dummy electrode may include polycrystalline silicon (polysilicon). As shown in FIG. 15, in the channel regions, the dummy gate stack 230 is in contact with the fifth dielectric layer 228, sidewalls of the third dielectric layer 224, top surfaces of the cladding layers 218, and top surfaces of top sacrificial layers 206T.

Reference is now made to FIG. 16, at least one gate spacer 232 is deposited over the workpiece 200, including along sidewalls of the dummy gate stacks 230. The at least one gate spacer 232 may include two or more gate spacer layers. Dielectric materials for the at least one gate spacer 232 may be selected to allow selective removal of the dummy gate stack 230. Suitable dielectric materials for the at least one gate spacer 232 may include silicon nitride, silicon oxycarbonitride, silicon carbonitride, silicon oxide, silicon oxycarbide, silicon carbide, silicon oxynitride, and/or combinations thereof. In an example process, the at least one gate spacer 232 may be conformally deposited over the workpiece 200 using CVD, subatmospheric CVD (SACVD), or ALD.

Referring to FIGS. 1, 16, 17 and 18, method 100 includes a block 124 where source/drain features 240 are formed over source/drain regions of the fin-shaped structures 212. Operations at block 124 include recessing of the source/drain regions of the fin-shaped structures 212 to form source/drain recesses 212SD (shown in FIG. 16), formation of inner spacer features 236 (shown in FIG. 17), and deposition of source/drain features 240 in the source/drain recesses 212SD (shown in FIG. 18). With the dummy gate stack 230 and the at least one gate spacer 232 serving as an etch mask, the workpiece 200 is anisotropically etched to form the source/drain recesses 212SD over the source/drain regions of the fin-shaped structures 212. The anisotropic etch at block 120 may include a dry etch process or a suitable etch process. For example, the dry etch process may implement an oxygen-containing gas, hydrogen, a fluorine-containing gas (e.g., $CF_4$, $SF_6$, $NF_3$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or), an iodine-containing gas, other suitable gases and/or plasmas, and/or combinations thereof. As shown in FIG. 16, the anisotropic etch at block 124 removes the sacrificial layers 206 and channel layers 208 in the source/drain regions and exposes sidewalls of the sacrificial layers 206 and channel layers 208 (shown in dotted lines) in the channel regions. While the anisotropic etch etches the fourth dielectric layer 226 at a slower rate, it nevertheless etches it. As shown in FIG. 16, the anisotropic etch may completely removes the fifth dielectric layer 228 and substantially remove the third dielectric layer 224 that is not covered by the fourth dielectric layer 226. The top edges of the fourth dielectric layer 226 may become chamfered or rounded.

Figure 17:
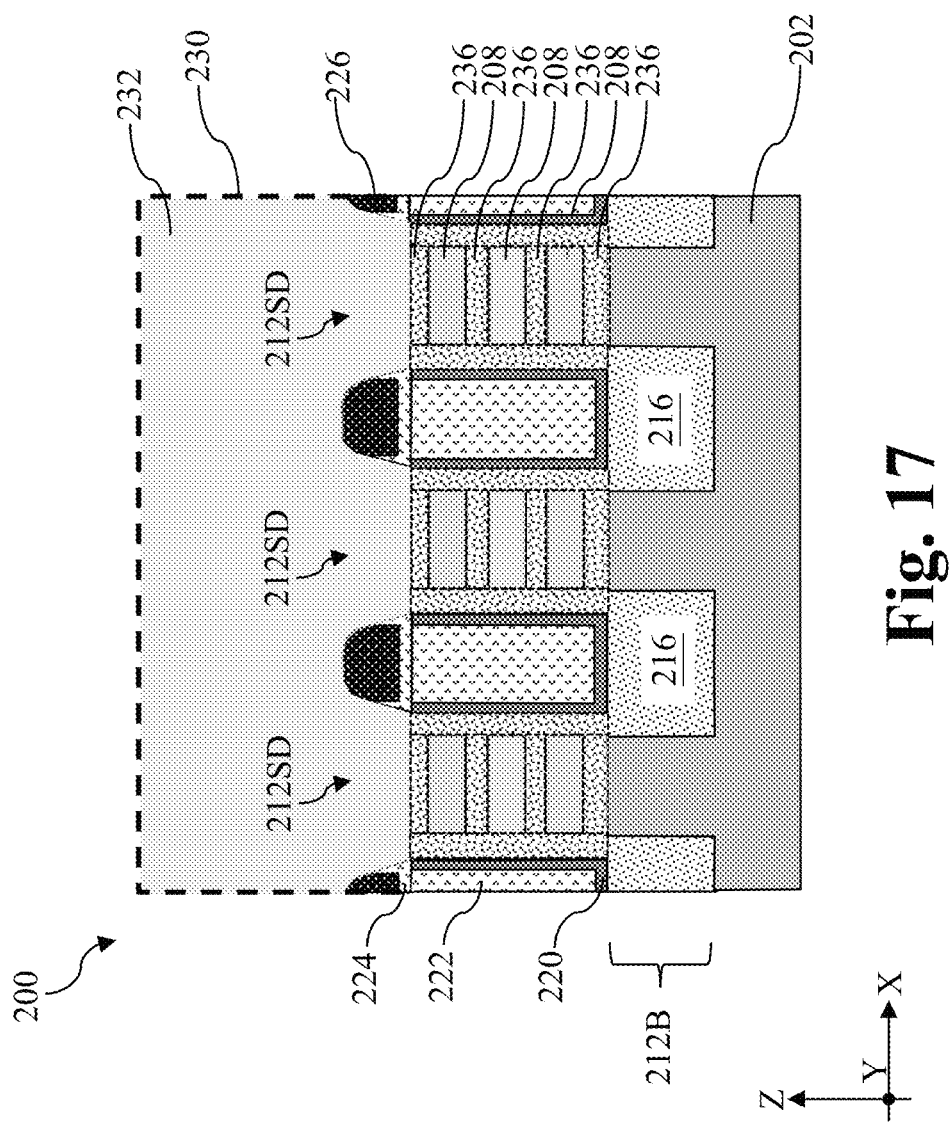

Reference is then made to FIG. 17. Operations at block 124 also include formation of inner spacer features 236 to interleave the channel layers 208. After the formation of the source/drain recesses 212SD, the sacrificial layers 206 (including the top sacrificial layer 206T) exposed in the source/drain recesses are first selectively and partially recessed to form inner spacer recesses, while the exposed channel layers 208 are substantially unetched. Because the cladding layer 218 and the sacrificial layers 206 share a similar composition (i.e., SiGe), the cladding layer 218 is also recessed at block 124. In an embodiment where the channel layers 208 consist essentially of silicon (Si), sacrificial layers 206 consist essentially of silicon germanium (SiGe), and the cladding layer 218 consists essentially of silicon germanium (SiGe), the selective and partial recess of the sacrificial layers 206 and the cladding layer 218 may include APM etch (e.g., ammonia hydroxide-hydrogen peroxide-water mixture). After the formation of the inner spacer recesses, an inner spacer material layer is then conformally deposited using CVD or ALD over the workpiece 200, including over and into the inner spacer recesses and the space left behind by the removed portion of the cladding layer 218. The inner spacer material may include silicon nitride, silicon oxycarbonitride, silicon carbonitride, silicon oxide, silicon oxycarbide, silicon carbide, or silico oxynitride. After the deposition of the inner spacer material layer, the inner spacer material layer is etched back to form inner spacer features 236, as shown in FIG. 17.

Figure 18:
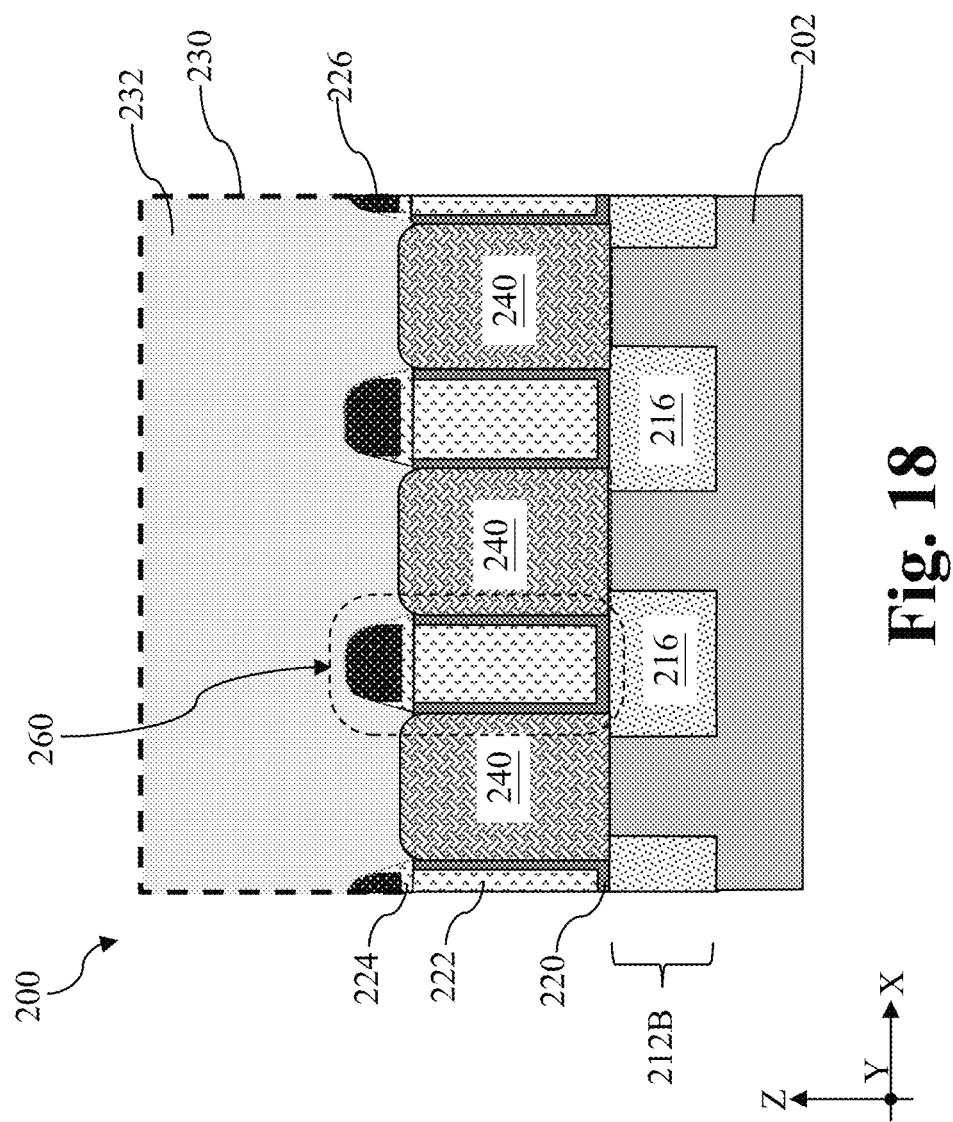

Reference is then made to FIG. 18. Operations at block 124 also includes deposition of source/drain features 240 in the source/drain recesses 212SD. In some embodiments, the source/drain features 240 may be selectively and epitaxially deposited on the exposed semiconductor surfaces of the channel layers 208 and the base portion 212B. The source/drain features 240 may be deposited using an epitaxial process, such as vapor-phase epitaxy (VPE), ultra-high vacuum CVD (UHV-CVD), molecular beam epitaxy (MBE), and/or other suitable processes. The source/drain features 240 may be either n-type or p-type. When the source/drain features 240 are n-type, it may include silicon (Si) and may be doped with an n-type dopant, such as phosphorus (P) or arsenic (As). When the source/drain features 240 are p-type, it may include silicon germanium (SiGe) and may be doped with a p-type dopant, such as boron (B) or boron difluoride ($BF_2$). Doping of the source/drain features 240 may be performed either in situ with their deposition or ex situ using an implantation process, such as a junction implant process. While not explicitly shown in the figures, the source/drain features 240 may include multiple epitaxial layers with different doping concentrations.

At conclusion of the operations at block 124, first dielectric fins 260 are formed. Each of the first dielectric fins 260 includes the bottom portion, the middle layer 224 over the bottom portion, and the helmet layer 226 over the middle layer 224. The bottom portion includes the first dielectric layer 220 as the outer layer and the second dielectric layer 222 as the inner layer. As shown in FIG. 18, the first dielectric fins 260 serve as dividers of source/drain features 240 in adjacent source/drain recesses. When the first dielectric fins 260 are not formed or are not tall or wide enough, adjacent source/drain features 240 may merge, causing undesirable shorts.

Figure 19:
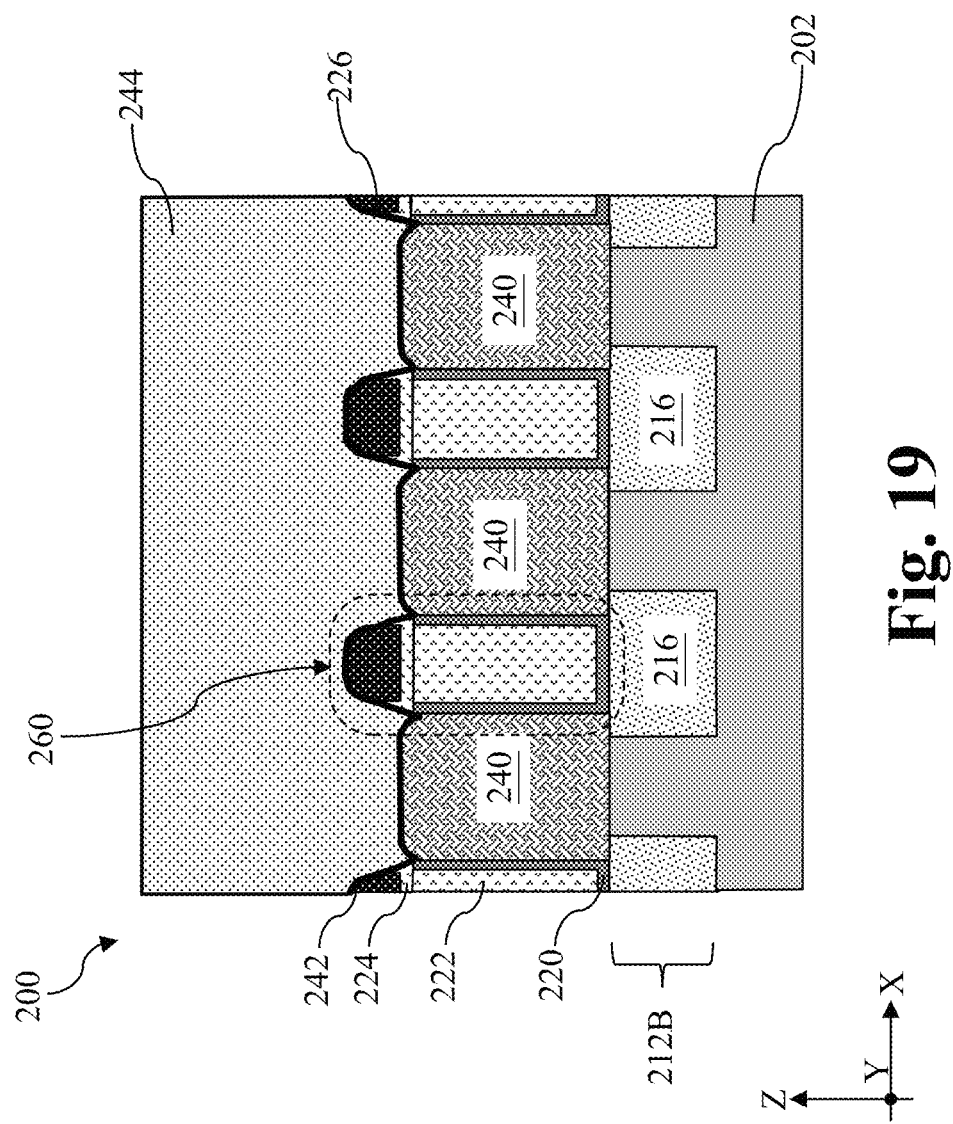
Figure 20:
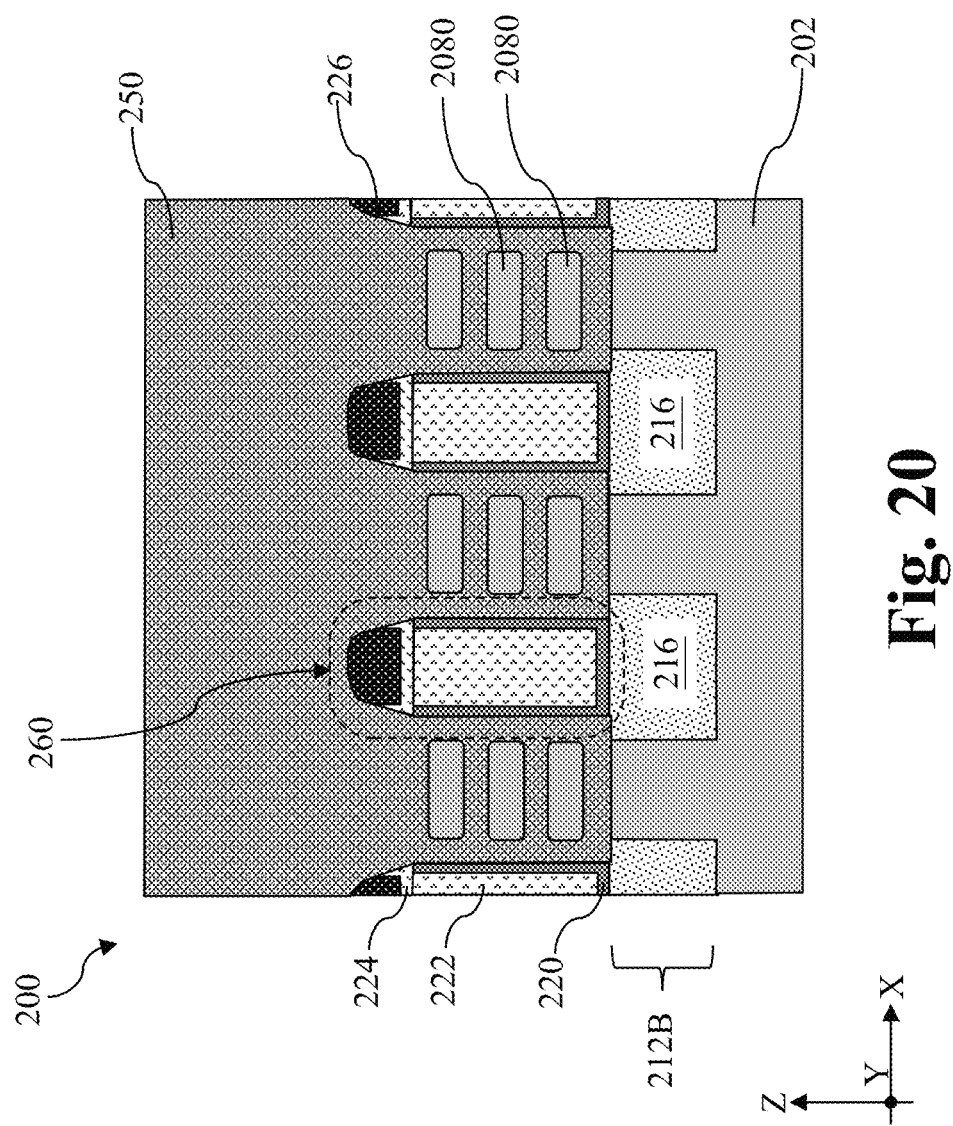
Figure 21:
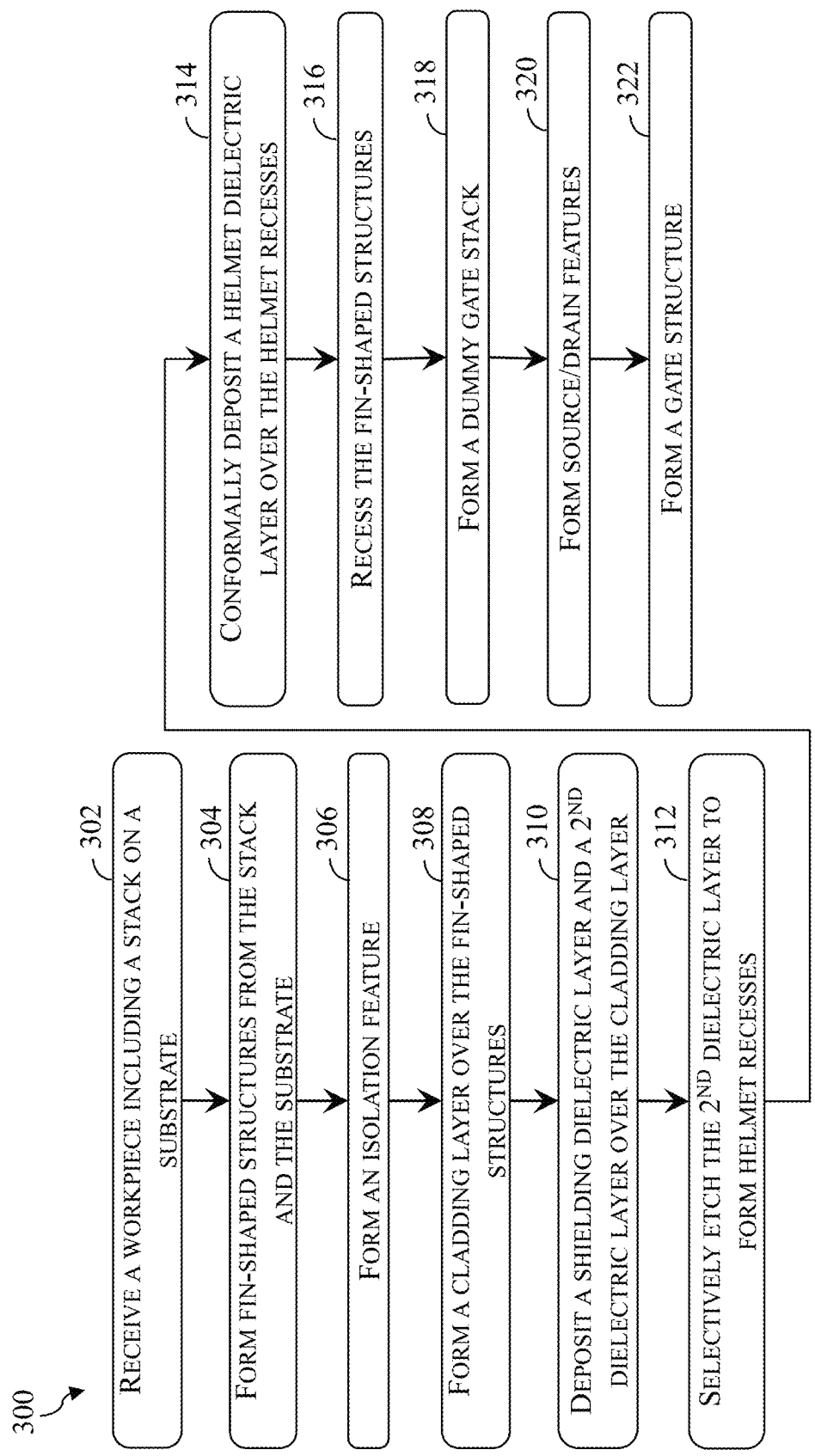
FIG. 21 illustrates a flowchart of a method 300 for forming a semiconductor structure, according to one or more aspects of the present disclosure.

Referring to FIGS. 1, 19 and 20, method 100 includes a block 126 where a gate structure 250 is formed. Operations at block 126 include deposition of a contact etch stop layer (CESL) 242 and an interlayer dielectric (ILD) layer 244 over the source/drain features 240 (shown in FIG. 19), removal of the dummy gate stack 230, selective removal of the sacrificial layers 206 to release the channel layers 208 as channel members 2080 (shown in FIG. 20), and formation of the gate structure 250 to wrap around each of the channel members 2080 (shown in FIG. 20). The CESL 242 and the ILD layer 244 are deposited over the source/drain features 240 to protect the same from subsequent processes. The CESL 242 may include silicon nitride and may be deposited on the source/drain features 240 and exposed surfaces of the middle layer 224 and the helmet layer 226 using ALD or CVD. The ILD layer 244 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 244 may be deposited on the CESL 242 by spin-on coating, an FCVD process, or other suitable deposition technique. After the deposition of the CESL 242 and the ILD layer 244, a planarization process (such a CMP process) may be performed to the workpiece 200 to provide a planar top surface that exposes the dummy gate stack 230. As shown in FIG. 19, the CESL 242 is in direct contact with sidewalls of the middle layer 224 and the rounded surface of the helmet layer 226.

While not explicitly shown, the exposed dummy gate stack 230 is then removed from the workpiece 200 by a selective etch process. The selective etch process may be a selective wet etch process, a selective dry etch process, or a combination thereof. In the depicted embodiments, the selective etch process selectively removes the dummy dielectric layer and the dummy electrode without substantially damaging the helmet layers 226 and the middle layers 224 in the channel regions. The removal of the dummy gate stack 230 results in a gate trench over the channel regions. The gate trenches are defined by the at least one gate spacer 232.

After the removal of the dummy gate stack 230, sacrificial layers 206 and the cladding layers 218 in the channel region may be selectively removed to release the channel layers 208 to form channel members 2080, shown in FIG. 20. Each of the channel members 2080 extends lengthwise along the Y direction between two source/drain features 240. As shown in FIG. 20, a vertical stack of the channel members 2080 is disposed directly over each of the base portion 212B. The selective removal of the sacrificial layers 206 and the cladding layer 218 may be implemented by selective dry etch, selective wet etch, or other selective etch processes. In some embodiments, the selective wet etching includes an APM etch (e.g., ammonia hydroxide-hydrogen peroxide-water mixture). In some alternative embodiments, the selective removal includes silicon germanium oxidation followed by a silicon germanium oxide removal. For example, the oxidation may be provided by ozone clean and then silicon germanium oxide removed by an etchant such as $NH_4OH$.

Referring still to FIG. 20, the gate structure 250 is then formed to wrap around each of the channel members 2080. While not explicitly shown in the figure, the gate structure 250 may include an interfacial layer on the channel members 2080 and the base portions 212B, a gate dielectric layer over the interfacial layer, and a gate electrode layer over the gate dielectric layer. In some embodiments, the interfacial layer includes silicon oxide and may be formed as result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed surfaces of the channel members 2080 and the base portions 212B to form the interfacial layer. The gate dielectric layer is then deposited over the interfacial layer using ALD, CVD, and/or other suitable methods. The gate dielectric layer may include high-K dielectric materials. As used herein, high-k dielectric materials include dielectric materials having a high dielectric constant, for example, greater than that of thermal silicon oxide (~3.9). In one embodiment, the gate dielectric layer may include hafnium oxide. Alternatively, the gate dielectric layer may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material. It is noted that the rounded helmet layer 226 and the etched middle layer 224 form a top portion that tapers away from the bottom portion (i.e., the first dielectric layer 220 and the second dielectric layer 222). The tapering provides a larger unhindered opening that facilitates the channel release process and the formation of the gate structure 250.

After the formation or deposition of the interfacial layer and the gate dielectric layer, a gate electrode layer is deposited over the gate dielectric layer. The gate electrode layer may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer may be formed by ALD, PVD, CVD, e-beam evaporation, or other suitable process.

While the gate structure 250 is shown in FIG. 20 as engaging multiple stack of channel members 2080, a subsequent planarization process, such as a CMP process, may be performed until the gate structure 250 is divided at least in part by the first dielectric fins 260 into segments. In some implementations, additional gate cut dielectric features may also be formed directly over one or more of the first dielectric fins 260 to divide the gate structure 250 into different segments.

FIG. 21 illustrates a flowchart for a method 300 that forms second dielectric fins 270 (shown in FIGS. 31-33) that are structurally different from the first dielectric fins 260 formed using method 100. Method 300 includes blocks 302, 304, 306, 308, 310, 312, 314, 316, 318, 320, and 322. Out of these blocks, operations at blocks 302, 304, 306, and 308 are substantially identical to those at blocks 102, 104, 106, and 108, respectively. Detailed description of operations at blocks 302, 304, 306, and 308 are therefore omitted for brevity and only brief descriptions thereof are provided. Operations at block 318, 320 and 322 bear similarities to those at blocks 122, 124 and 126, respectively. For that reasons, description of blocks 318, 320 and 322 below focuses more on the differences in operations due to different formation and structure of the second dielectric fins 270.

Referring to FIGS. 21 and 2, method 300 includes a block 302 where a workpiece 200 is received. As shown in FIG. 2, the workpiece 200 includes a substrate 202 and a stack 204 disposed on the substrate 202. The substrate 202 and the stack 204 have been described above with respect to block 102 of method 100 and will not be repeated here.

Referring to FIGS. 21 and 3, method 300 includes a block 304 where fin-shaped structure 212 are formed. The fin-shaped structures 212 are defined by trenches 211. As shown in FIG. 3, each of the fin-shaped structures 212 includes a base portion 212B formed from a portion of the substrate 202 and a top portion 212T formed from the stack 204. Descriptions of operations at 304 have been provided above with respect to block 104 of method 100 and will not be repeated here.

Referring to FIGS. 21 and 4, method 300 includes a block 306 where an isolation feature 216 is formed. As shown in FIG. 4, the top portions 212T of the fin-shaped structures 212 rise above the isolation feature 216 while the base portions 212B are surrounded by the isolation feature 216.

Descriptions of operations at 306 have been provided above with respect to block 106 of method 100 and will not be repeated here.

Referring to FIGS. 21 and 5, method 300 includes a block 308 where a cladding layer 218 is formed over the fin-shaped structures 212. Descriptions of operations at 308 have been provided above with respect to block 108 of method 100 and will not be repeated here.

Figure 22:
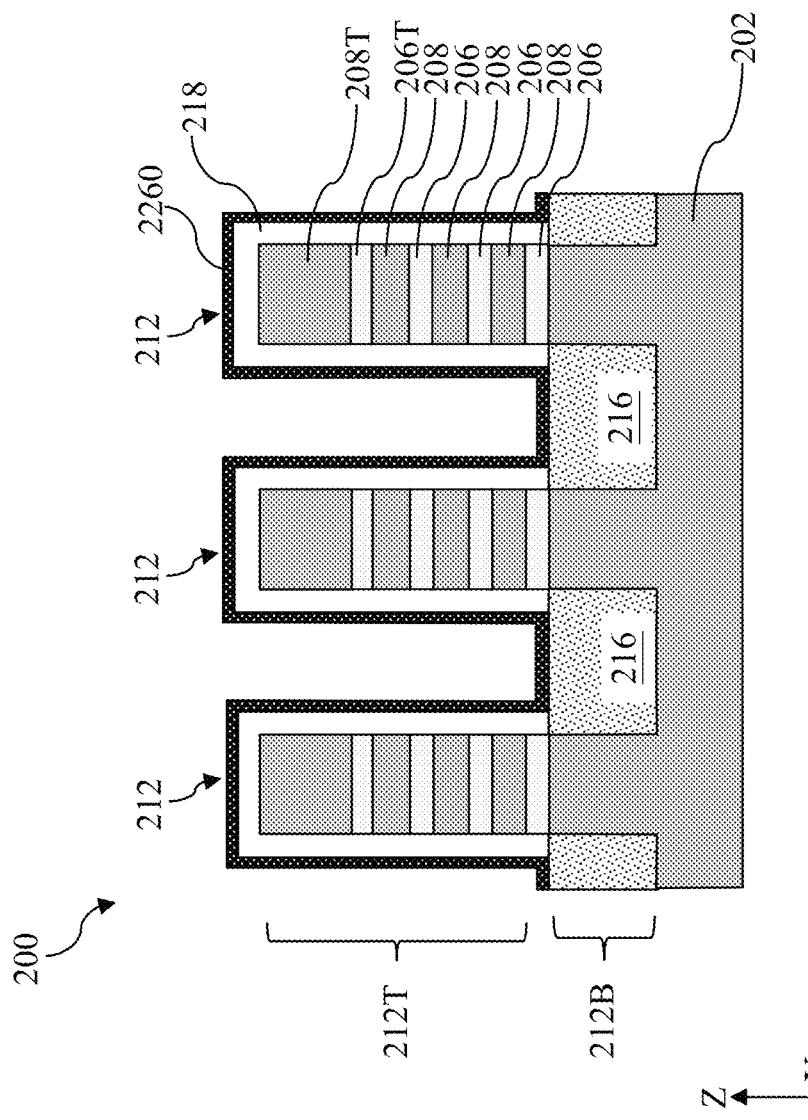
FIGS. 22-34 illustrate fragmentary cross-sectional views of a workpiece during various fabrication stages in the method 300 of FIG. 21, according to one or more aspects of the present disclosure.
Figure 23:
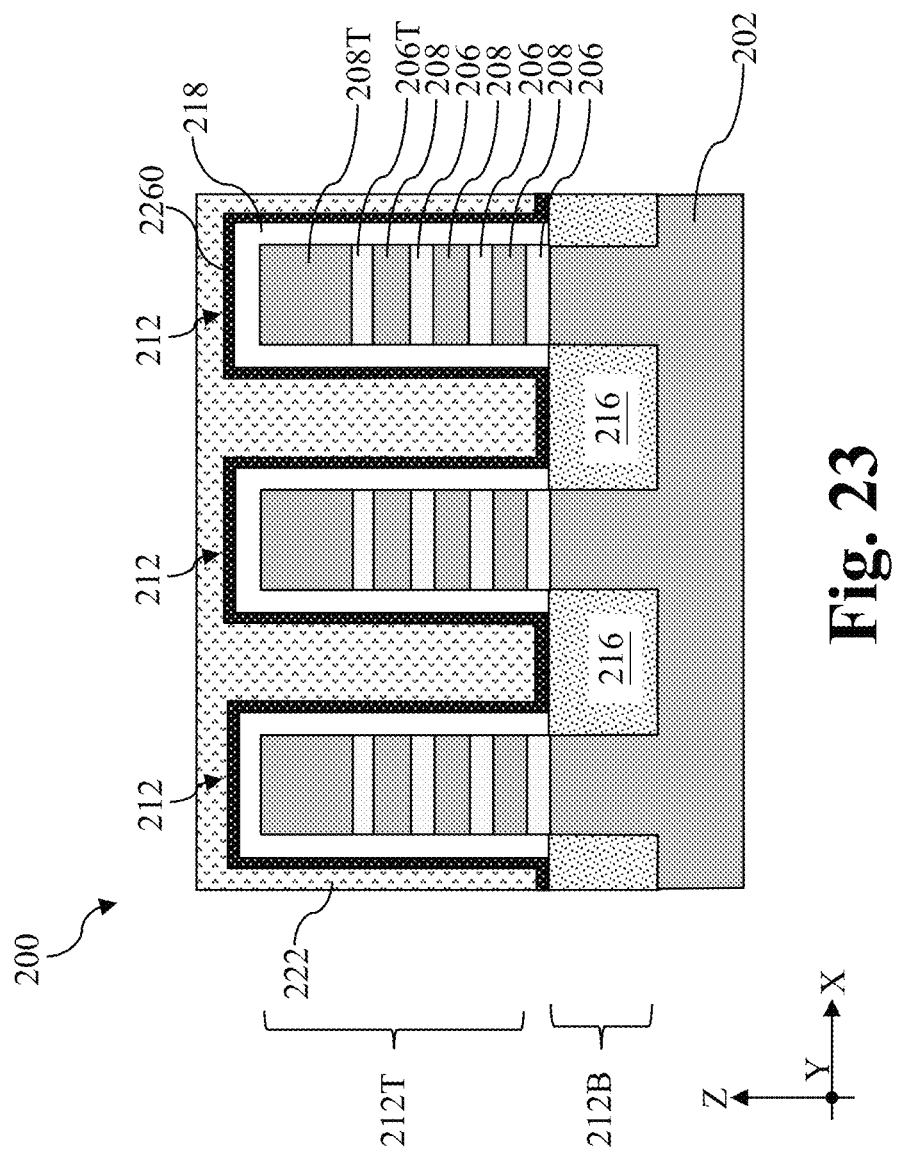

Referring to FIGS. 21, 22 and 23, method 300 includes a block 310 where a shielding dielectric layer 2260 and a second dielectric layer 222 are deposited over the workpiece 200, including over the cladding layer 218 and trenches 211. In an example process, the shielding dielectric layer 2260 is conformally deposited over the workpiece 200, including in the trenches 211, as shown in FIG. 22. The shielding dielectric layer 2260 may be deposited using PECVD, ALD, or a suitable method. The shielding dielectric layer 2260 lines the sidewalls and the bottom surfaces of the trenches 211, which is defined by the cladding layer 218 before the operations at block 310. Due to its conformal nature, the shielding dielectric layer 2260 may also be referred to as a shielding dielectric layer 2260. In some embodiments, the shielding dielectric layer 2260 is formed to a thickness between about 2 nm and about 15 nm. Referring to FIG. 23, a second dielectric layer 222 is then deposited over the shielding dielectric layer 2260 on the workpiece 200 using CVD, SACVD, FCVD, ALD, spin-on coating, and/or other suitable process. The second dielectric layer 222 may also be referred to as a dielectric filler 222 or an inner layer 222. The shielding dielectric layer 2260 may include a metal oxide or a rare metal oxide, such as hafnium oxide, ruthenium oxide, lanthanum oxide, rhenium oxide, aluminum oxide, or zirconium oxide. The second dielectric layer 222 may include an oxygen-containing semiconductor oxide, such as silicon oxide, silica glass, or fluorine-doped silicon oxide, silicon oxide or other dielectric layers that are fully oxidized or are unlikely to be oxidized by an oxidizer. In the depicted embodiment, the second dielectric layer 222 is formed of silicon oxide. In the depicted embodiment, a dielectric constant of the shielding dielectric layer 2260 is greater than a dielectric constant of the second dielectric layer 222. In some instances, a dielectric constant of the shielding dielectric layer 2260 may be about 2 times to about 6 times of that of the second dielectric layer 222.

Figure 24:
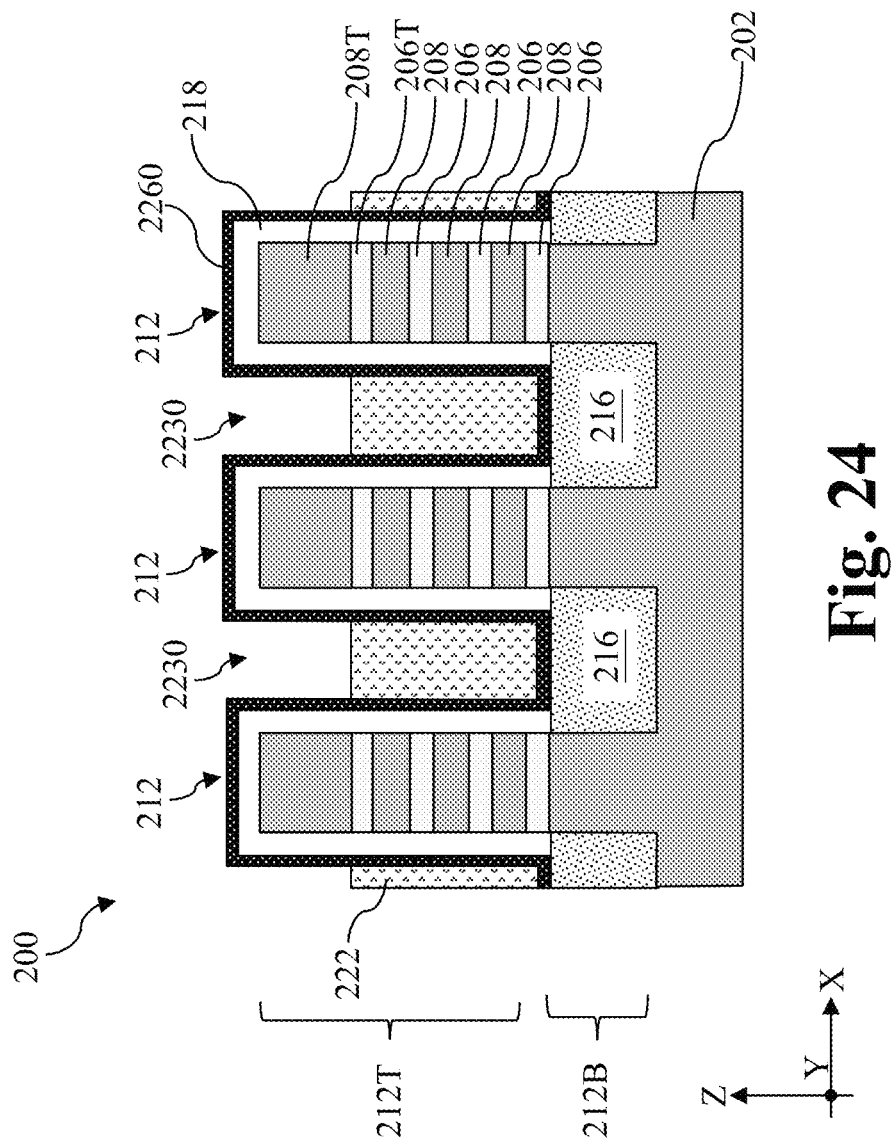

Referring to FIGS. 21 and 24, method 300 includes a block 312 where the second dielectric layer 222 is selectively etched back to form second helmet recesses 2230. The etching process at block 312 is highly selective to the second dielectric layer 222, which are formed of silicon oxide or silicon-oxide-like dielectric materials. In some embodiments, the selective etching process at block 312 may be a dry etch process or a wet etch process. An example dry etch process may include use of trifluoromethane ($CHF_3$), fluoromethane ($CF_4$), or nitrogen trifluoride (NF3). An example wet etch process may include use of hydrofluoric acid (HF), diluted hydrofluoric acid (DHF), or ammonium fluoride ($NH_4F$). In an example process, the selective etching at block 312 includes multiple cycles of ammonia ($NH_3$) exposure and multiple cycles of hydrofluoric acid (HF) exposure. As shown in FIG. 24, because the etching process at block 312 is selective to the second dielectric layer 222, the shielding dielectric layer 2260 is substantially undamaged and serves to protect the cladding layer 218 and the fin-shaped structures 212. At conclusion of operations at block 312, the second helmet recesses 2230 are formed over the second dielectric layer 222 between two adjacent top portion 212T. Each of the second helmet recesses 2230 is defined between the shielding dielectric layer 2260 extending along sidewalls of the adjacent fin-shaped structures 212. While not explicitly shown in the figures, in some alternative embodiments the etch back at block 312 may progress further toward the substrate 202 to form a deeper second helmet recesses 2230. Such a deep second helmet recesses 2230 may result in formation of thicker etch resistant dielectric materials to improve fabrication process window and process yield.

Figure 25:
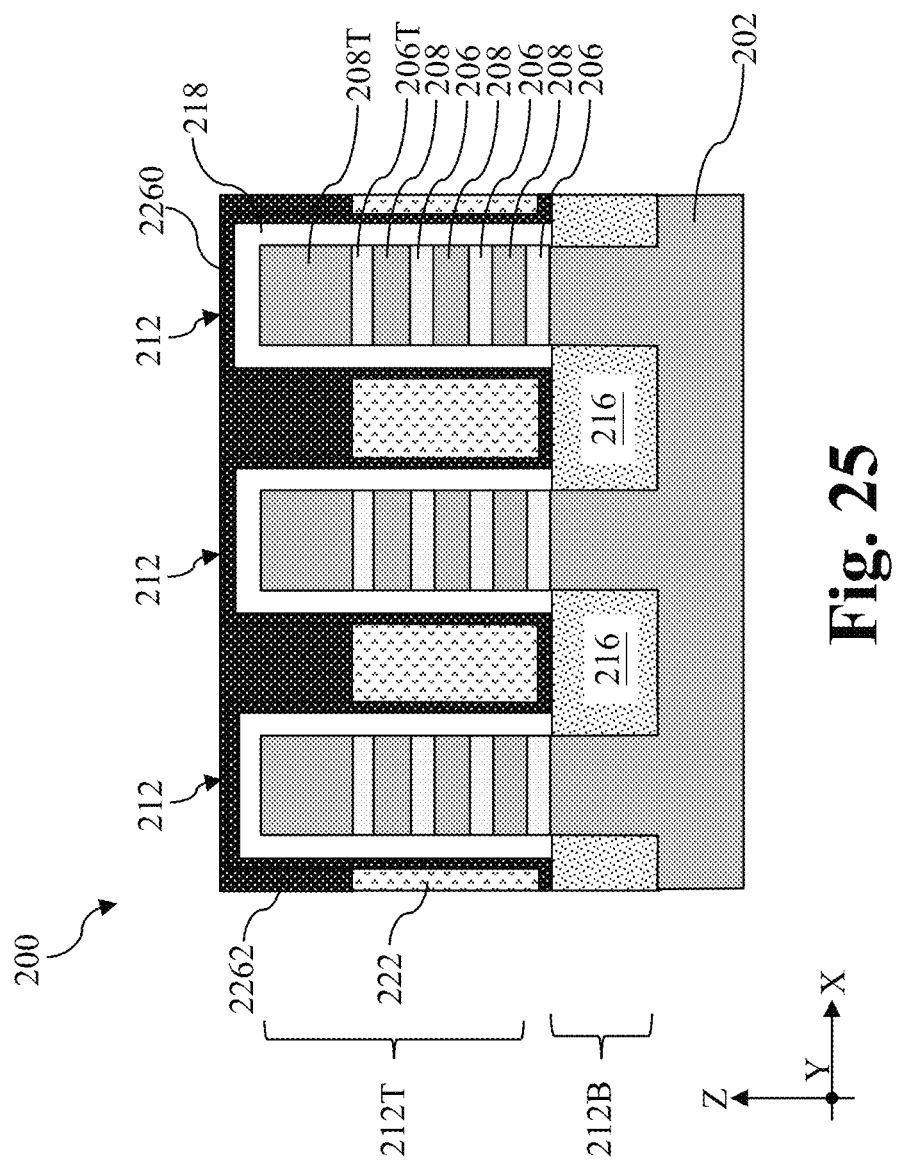

Referring to FIGS. 21 and 25, method 300 includes a block 314 where a helmet dielectric layer 2262 is deposited over the workpiece 200, including over the second helmet recesses 2230. In an example process, the helmet dielectric layer 2262 is then deposited over the shielding dielectric layer 2260 and the second dielectric layer 222 on the workpiece 200 using CVD, SACVD, FCVD, ALD, spin-on coating, and/or other suitable process. In some embodiments, the helmet dielectric layer 2262 and the shielding dielectric layer 2260 may share the same composition. In some instances, the helmet dielectric layer 2262 may include a metal oxide or a rare metal oxide, such as hafnium oxide, ruthenium oxide, lanthanum oxide, rhenium oxide, aluminum oxide, or zirconium oxide. In the depicted embodiment, a dielectric constant of the helmet dielectric layer 2262 is greater than a dielectric constant of the second dielectric layer 222. In one embodiment, the shielding dielectric layer 2260 includes hafnium oxide, the second dielectric layer 222 includes silicon oxide, the helmet dielectric layer 2262 includes hafnium oxide.

Figure 26:
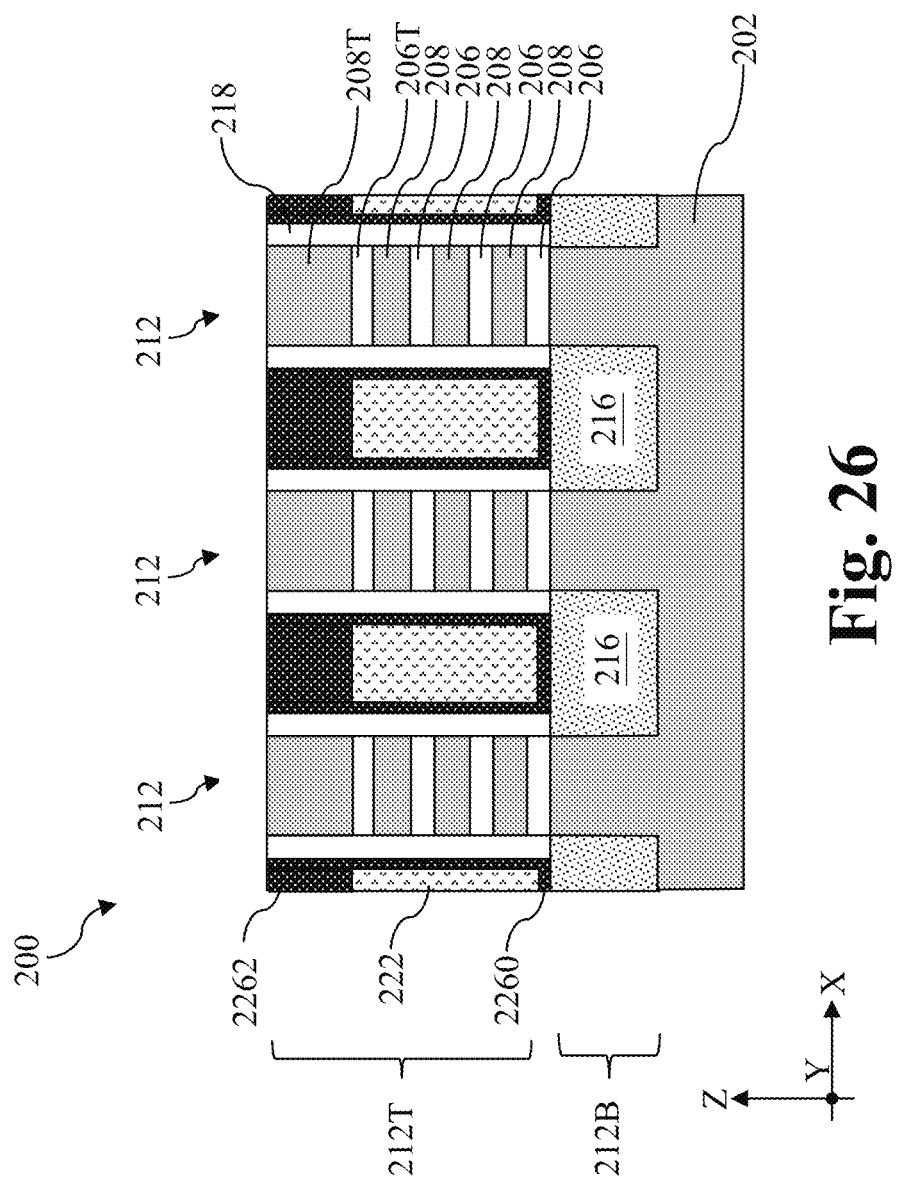
Figure 27:
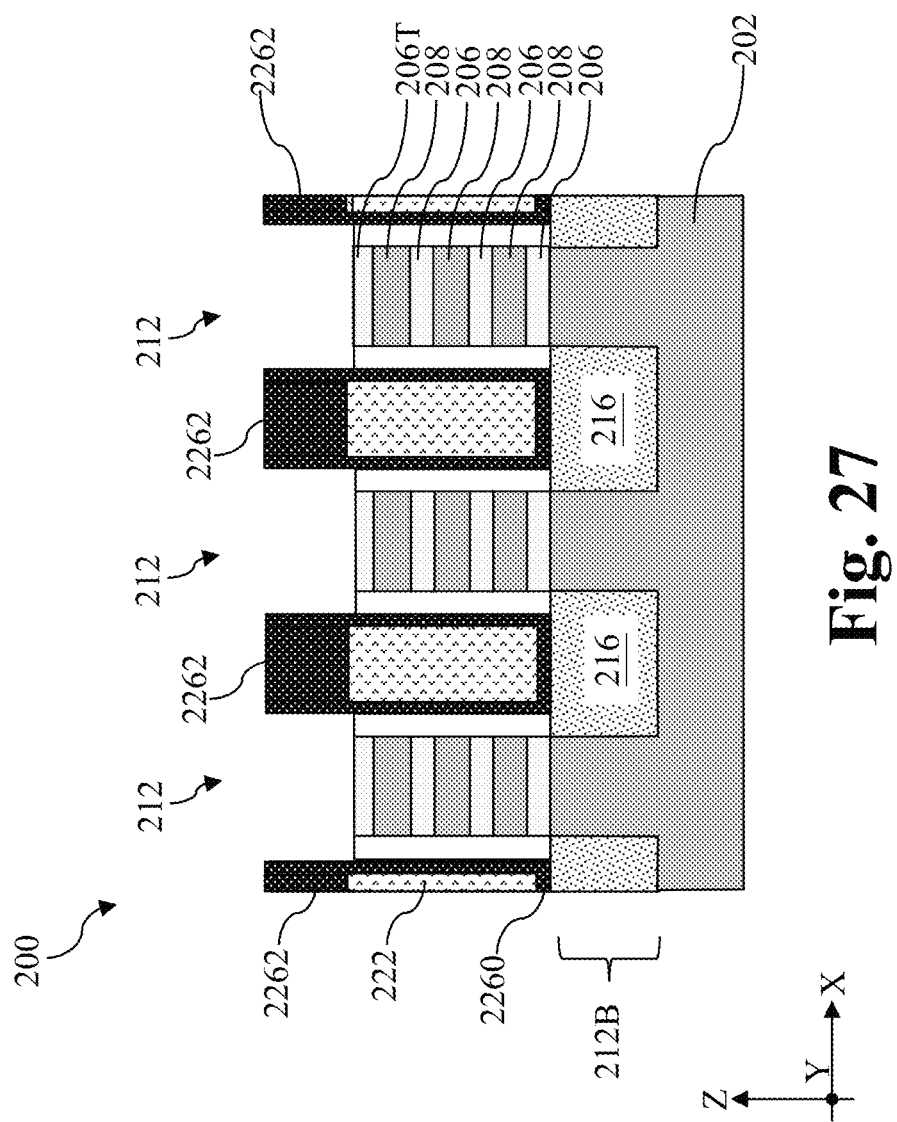

Referring to FIGS. 21, 26 and 27, method 300 includes a block 316 where the fin-shaped structures 212 are recessed. After the deposition of the helmet dielectric layer 2262, the workpiece 200 is planarized using a chemical mechanical polishing (CMP) process to expose the fin-shaped structures 212, as shown in FIG. 26. With top surfaces of the fin-shaped structures 212 exposed, the top channel layer 208T, the top sacrificial layer 206T and a top portion of the cladding layer 218 are recessed. In some embodiments represented in FIG. 27, a top portion of the cladding layer 218 and the top channel layer 208T are selectively removed to expose the top sacrificial layer 206T of each of the fin-shaped structures 212. In some embodiments, the selective etch at block 316 may include use of ammonium hydroxide, ozonated water ($DI-O_3$), and/or hydrofluoric acid (HF). Although not explicitly shown in the figures, a portion of the top sacrificial layer 206T may also be recessed by the etch process. In at least some embodiments, the top sacrificial layer 206T functions to protect the topmost channel layer 208 and is not breached through at block 316. It is noted that the selective etch at block 316 is mask-less and is self-aligned because the selective etch at block 316 etches the shielding dielectric layer 2260 and the helmet dielectric layer 2262 at a much slower rate.

Figure 28:
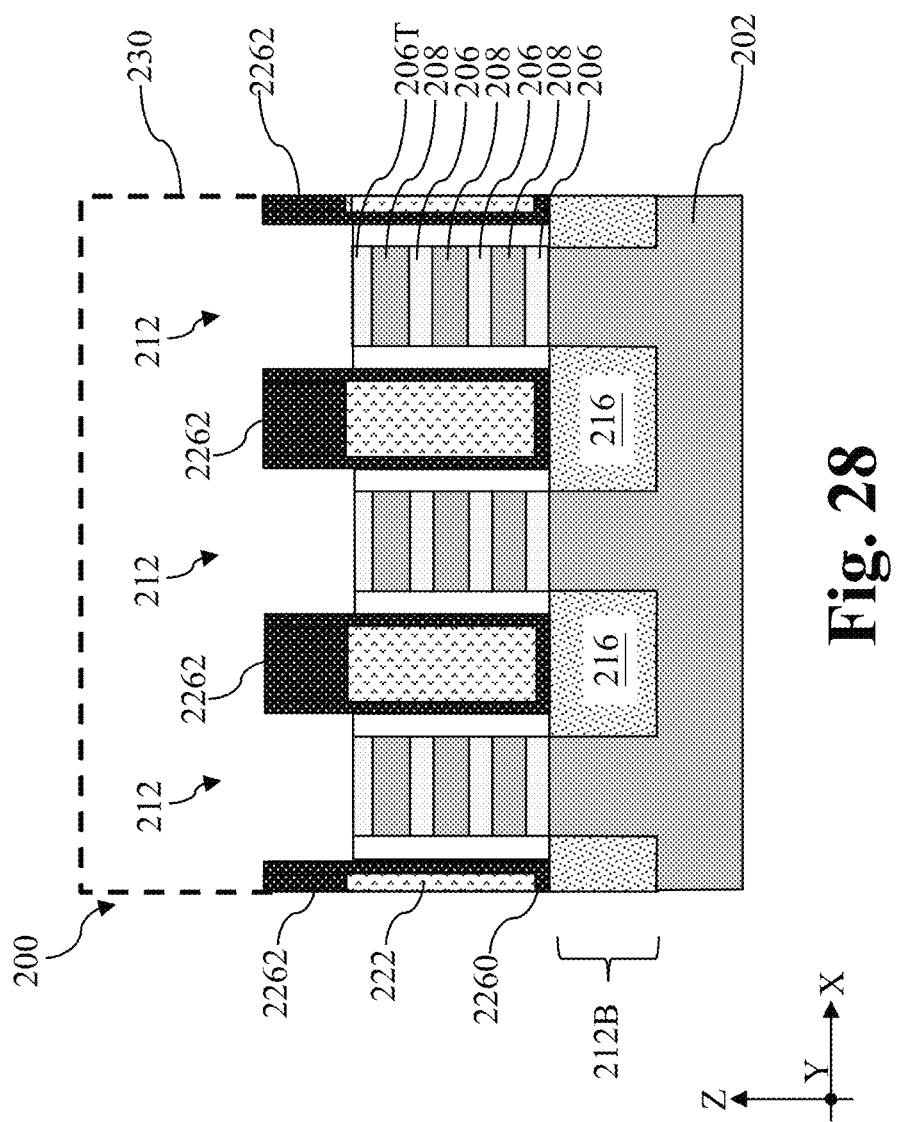
Figure 29:
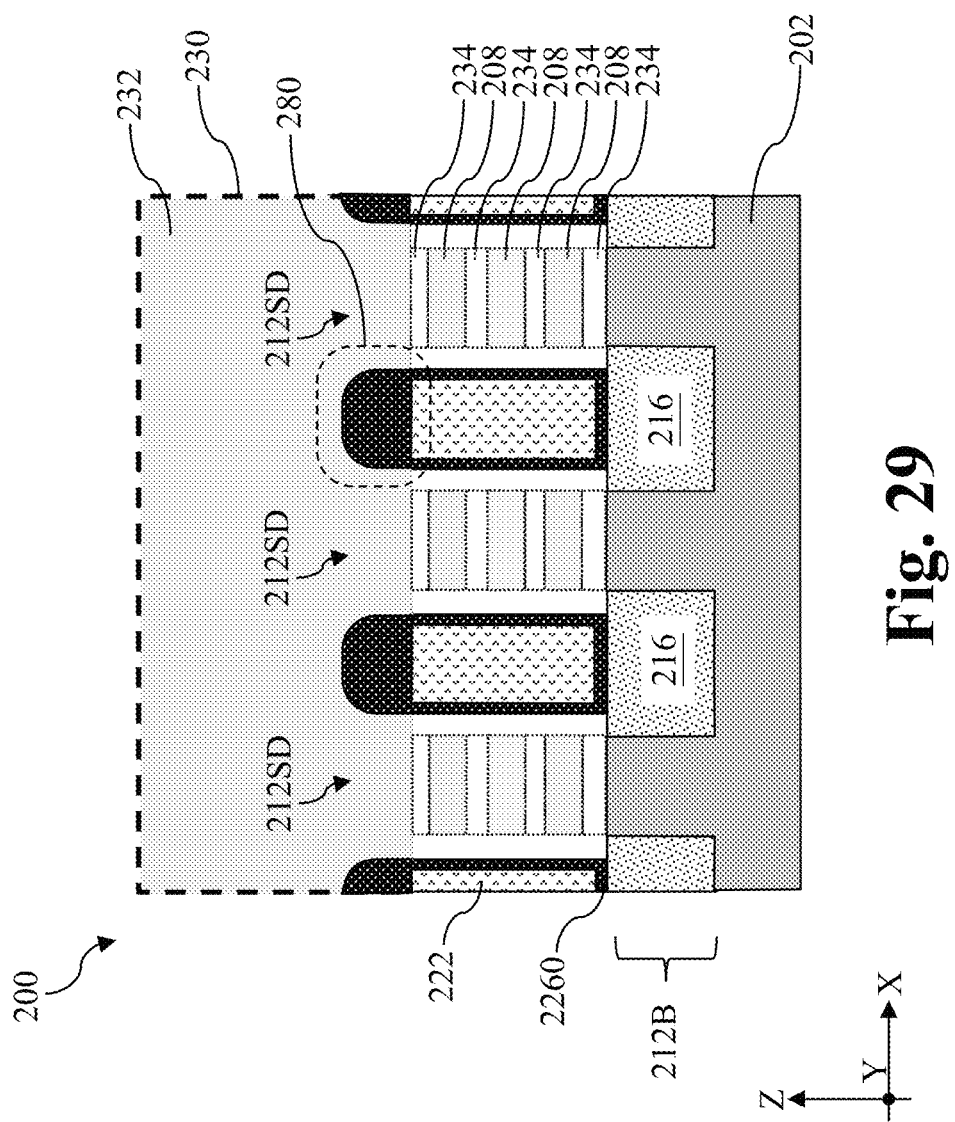

Referring to FIGS. 21, 28 and 29, method 300 includes a block 318 where a dummy gate stack 230 is formed over channel regions of the fin-shaped structures 212. In some embodiments, a gate replacement process (or gate-last process) is adopted where the dummy gate stack 230 serves as a placeholder for a functional gate structure that is formed at a later step. Other processes and configuration are possible. Although not explicitly shown in FIG. 28, the dummy gate stack 230 includes a dummy dielectric layer and a dummy electrode disposed over the dummy dielectric layer. The regions of the fin-shaped structures 212 underlying the dummy gate stack 230 may be referred to as channel regions. Each of the channel regions in a fin-shaped structure 212 is sandwiched along the Y direction between two source/drain regions for source/drain formation. In an example process, the dummy dielectric layer is blanketly deposited over the workpiece 200 by CVD. A material layer for the dummy electrode is then blanketly deposited over the dummy dielectric layer. The dummy dielectric layer and the material layer for the dummy electrode are then patterned using photolithography processes to form the dummy gate stack 230. In some embodiments, the dummy dielectric layer may include silicon oxide and the dummy electrode may include polycrystalline silicon (polysilicon). As shown in FIG. 28, in the channel regions, the dummy gate stack 230 is in contact with top surfaces of the helmet dielectric layers 2262, top surfaces of the shielding dielectric layers 2260, sidewalls of the shielding dielectric layers 2260, top surfaces of the cladding layer 218, and top surfaces of the top sacrificial layers 206T.

Reference is now made to FIG. 29, at least one gate spacer 232 is deposited over the workpiece 200, including along sidewalls of the dummy gate stacks 230. The at least one gate spacer 232 may include two or more gate spacer layers. Dielectric materials for the at least one gate spacer 232 may be selected to allow selective removal of the dummy gate stack 230. Suitable dielectric materials for the at least one gate spacer 232 may include silicon nitride, silicon oxycarbonitride, silicon carbonitride, silicon oxide, silicon oxycarbide, silicon carbide, silicon oxynitride, and/or combinations thereof. In an example process, the at least one gate spacer 232 may be conformally deposited over the workpiece 200 using CVD, subatmospheric CVD (SACVD), or ALD.

Referring to FIGS. 21, 29, 30 and 31, method 300 includes a block 320 where source/drain features 240 are formed over source/drain regions of the fin-shaped structures 212. Operations at block 320 include recessing of the source/drain regions of the fin-shaped structures 212 to form source/drain recesses 212SD (shown in FIG. 29), formation of inner spacer features 236 (shown in FIG. 30), and deposition of source/drain features 240 in the source/drain recesses 212SD (shown in FIG. 31). With the dummy gate stack 230 and the at least one gate spacer 232 serving as an etch mask, the workpiece 200 is anisotropically etched to form the source/drain recesses 212SD over the source/drain regions of the fin-shaped structures 212. The anisotropic etch at block 320 may include a dry etch process or a suitable etch process. For example, the dry etch process may implement an oxygen-containing gas, hydrogen, a fluorine-containing gas (e.g., $CF_4$, $SF_6$, $NF_3$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As shown in FIG. 29, the anisotropic etch at block 320 removes the sacrificial layers 206 and channel layers 208 in the source/drain regions and exposes sidewalls of the sacrificial layers 206 and channel layers 208 (shown in dotted lines) in the channel regions. While the anisotropic etch etches the shielding dielectric layer 2260 and the helmet dielectric layer 2262 at a slower rate, it nevertheless etches them. As shown in FIG. 29, the anisotropic etch may result in rounded corners of the top edges of the shielding dielectric layer 2260 and the helmet dielectric layer 2262, which together may form rounded helmet features 280.

Figure 30:
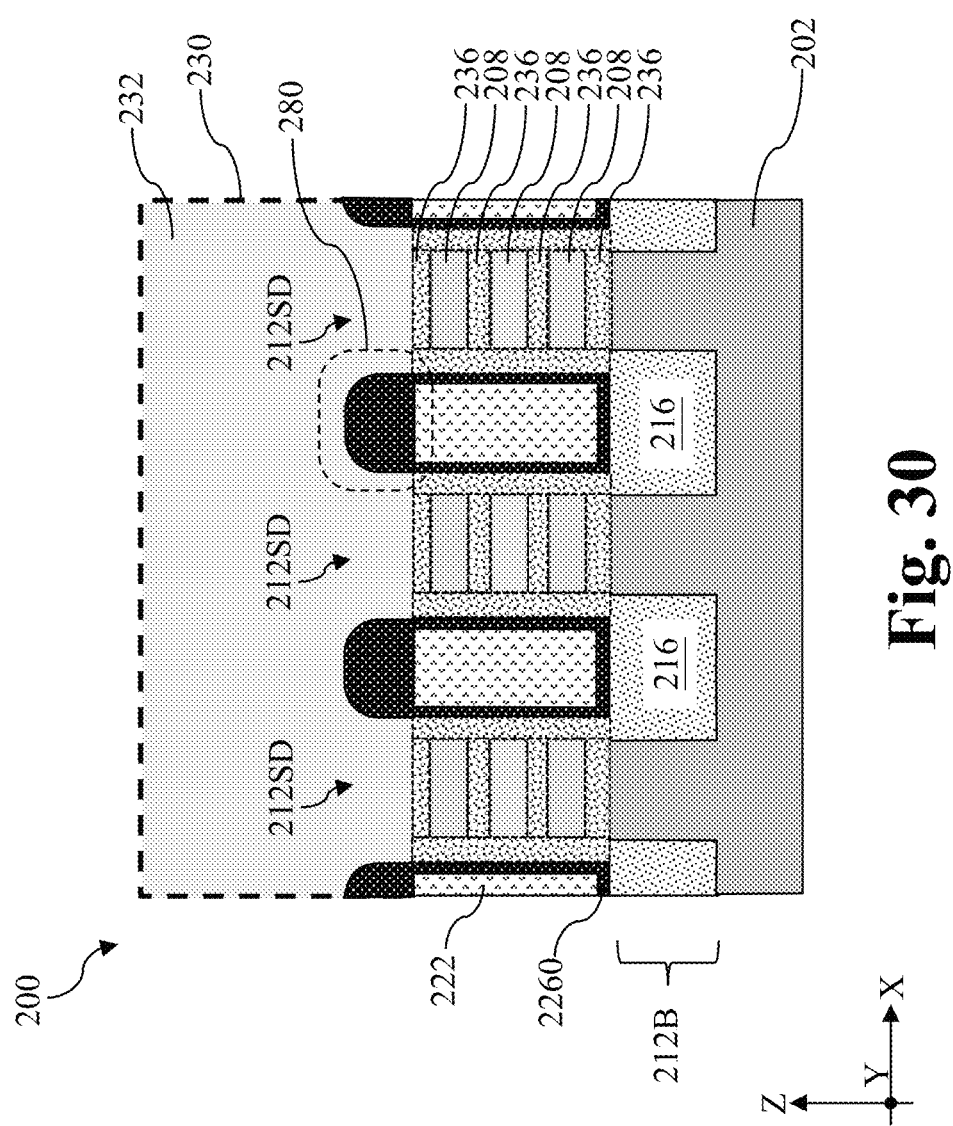

Reference is then made to FIG. 30. Operations at block 320 also include formation of inner spacer features 236 to interleave the channel layers 208. After the formation of the source/drain recesses 212SD, the sacrificial layers 206 (including the top sacrificial layer 206T) exposed in the source/drain recesses are first selectively and partially recessed to form inner spacer recesses, while the exposed channel layers 208 are substantially unetched. Because the cladding layer 218 and the sacrificial layers 206 share a similar composition (i.e., SiGe), the cladding layer 218 is also recessed at block 320. In an embodiment where the channel layers 208 consist essentially of silicon (Si), sacrificial layers 206 consist essentially of silicon germanium (SiGe), and the cladding layer 218 consists essentially of silicon germanium (SiGe), the selective and partial recess of the sacrificial layers 206 and the cladding layer 218 may include APM etch (e.g., ammonia hydroxide-hydrogen peroxide-water mixture). After the formation of the inner spacer recesses, an inner spacer material layer is then conformally deposited using CVD or ALD over the workpiece 200, including over and into the inner spacer recesses and the space left behind by the removed portion of the cladding layer 218. The inner spacer material may include silicon nitride, silicon oxycarbonitride, silicon carbonitride, silicon oxide, silicon oxycarbide, silicon carbide, or silico oxynitride. After the deposition of the inner spacer material layer, the inner spacer material layer is etched back to form inner spacer features 236, as shown in FIG. 30.

Figure 31:
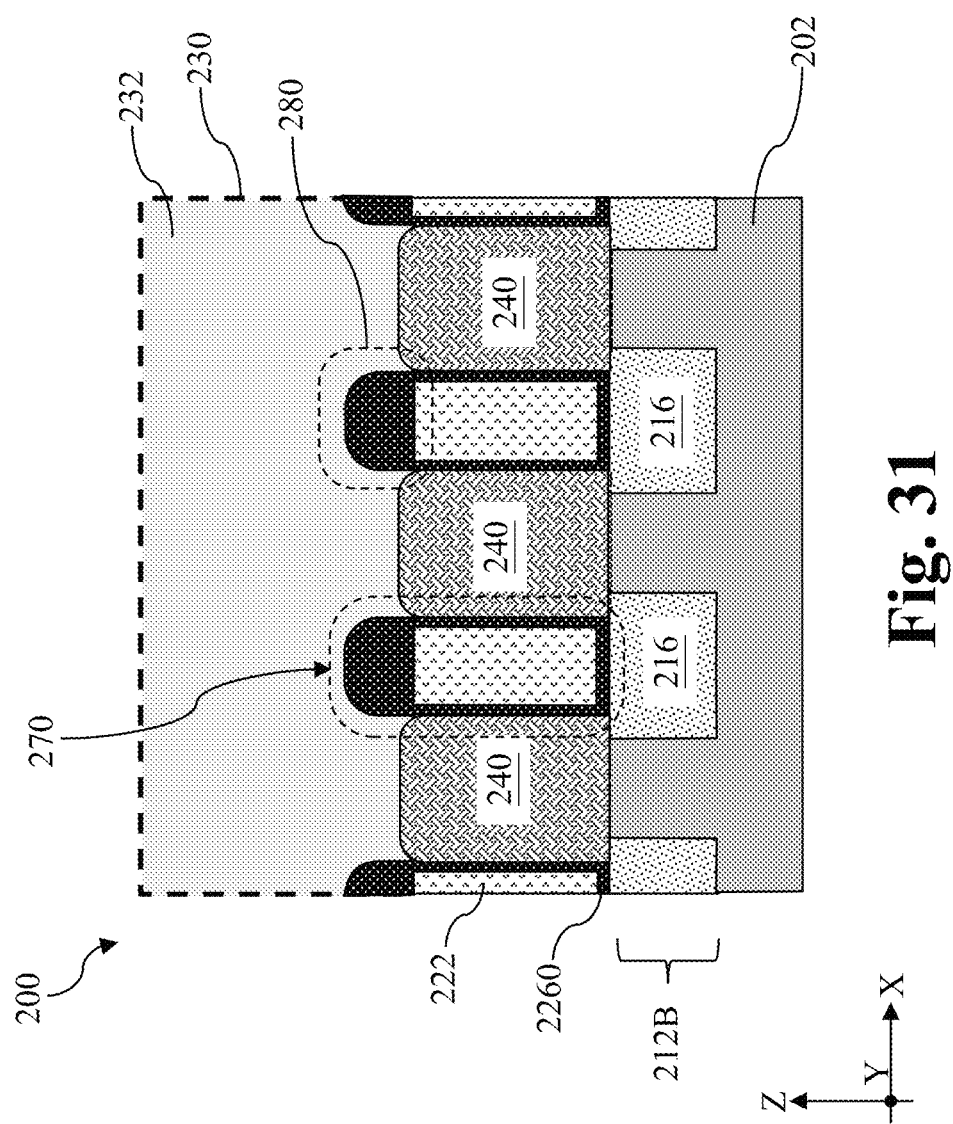

Reference is then made to FIG. 31. Operations at block 320 also includes deposition of source/drain features 240 in the source/drain recesses 212SD. In some embodiments, the source/drain features 240 may be selectively and epitaxially deposited on the exposed semiconductor surfaces of the channel layers 208 and the base portion 212B. The source/drain features 240 may be deposited using an epitaxial process, such as vapor-phase epitaxy (VPE), ultra-high vacuum CVD (UHV-CVD), molecular beam epitaxy (MBE), and/or other suitable processes. The source/drain features 240 may be either n-type or p-type. When the source/drain features 240 are n-type, it may include silicon (Si) and may be doped with an n-type dopant, such as phosphorus (P) or arsenic (As). When the source/drain features 240 are p-type, it may include silicon germanium (SiGe) and may be doped with a p-type dopant, such as boron (B) or boron difluoride ($BF_2$). Doping of the source/drain features 240 may be performed either in situ with their deposition or ex situ using an implantation process, such as a junction implant process. While not explicitly shown in the figures, the source/drain features 240 may include multiple epitaxial layers with different doping concentrations.

At conclusion of the operations at block 320, second dielectric fins 270 are formed. Each of the second dielectric fins 270 includes a bottom base and the helmet feature 280. The bottom base includes the shielding dielectric layer 2260 as the outer layer and the second dielectric layer 222 as the inner layer. As shown in FIG. 31, the second dielectric fins 270 serve as dividers of source/drain features 240 in adjacent source/drain recesses. When the second dielectric fins 270 are not formed or are not tall or wide enough, adjacent source/drain features 240 may merge, causing undesirable shorts.

Figure 32:
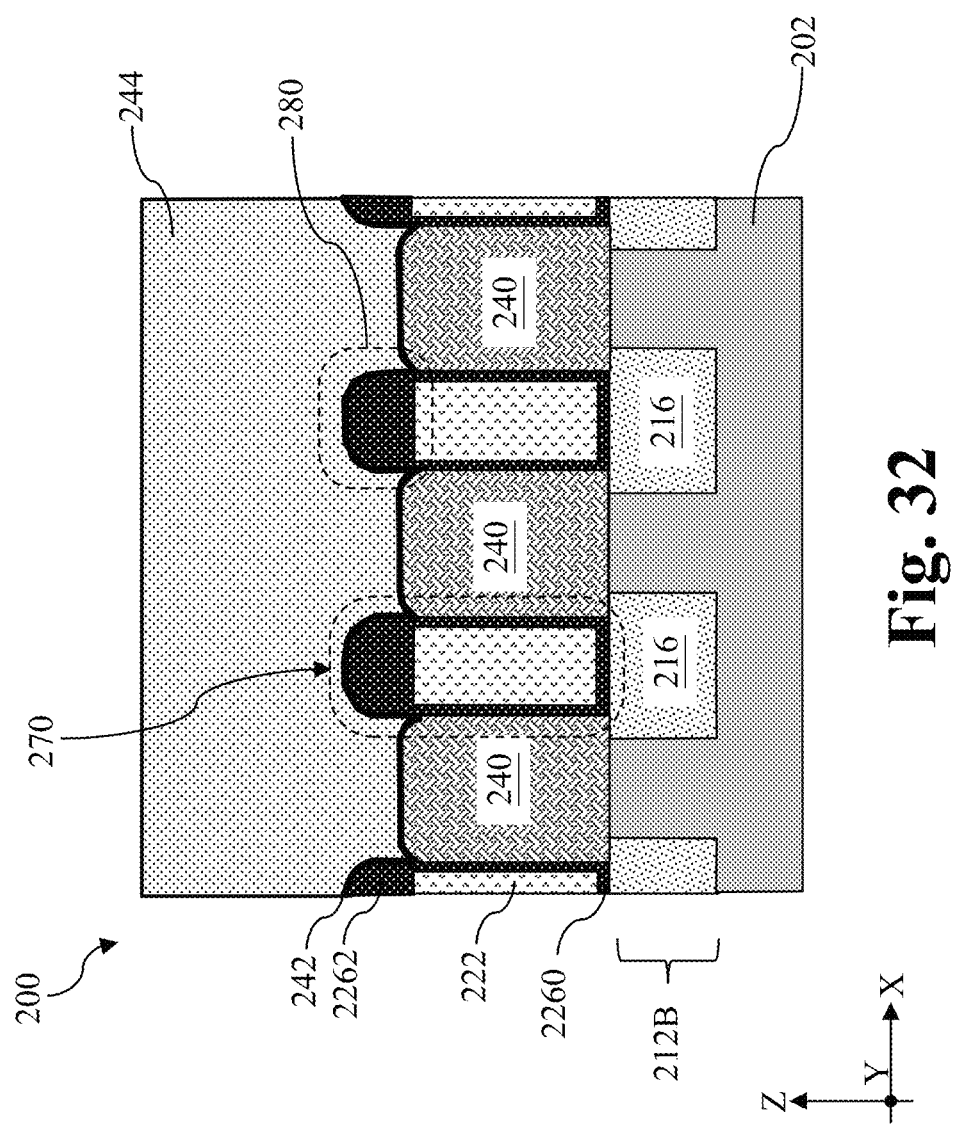
Figure 33:
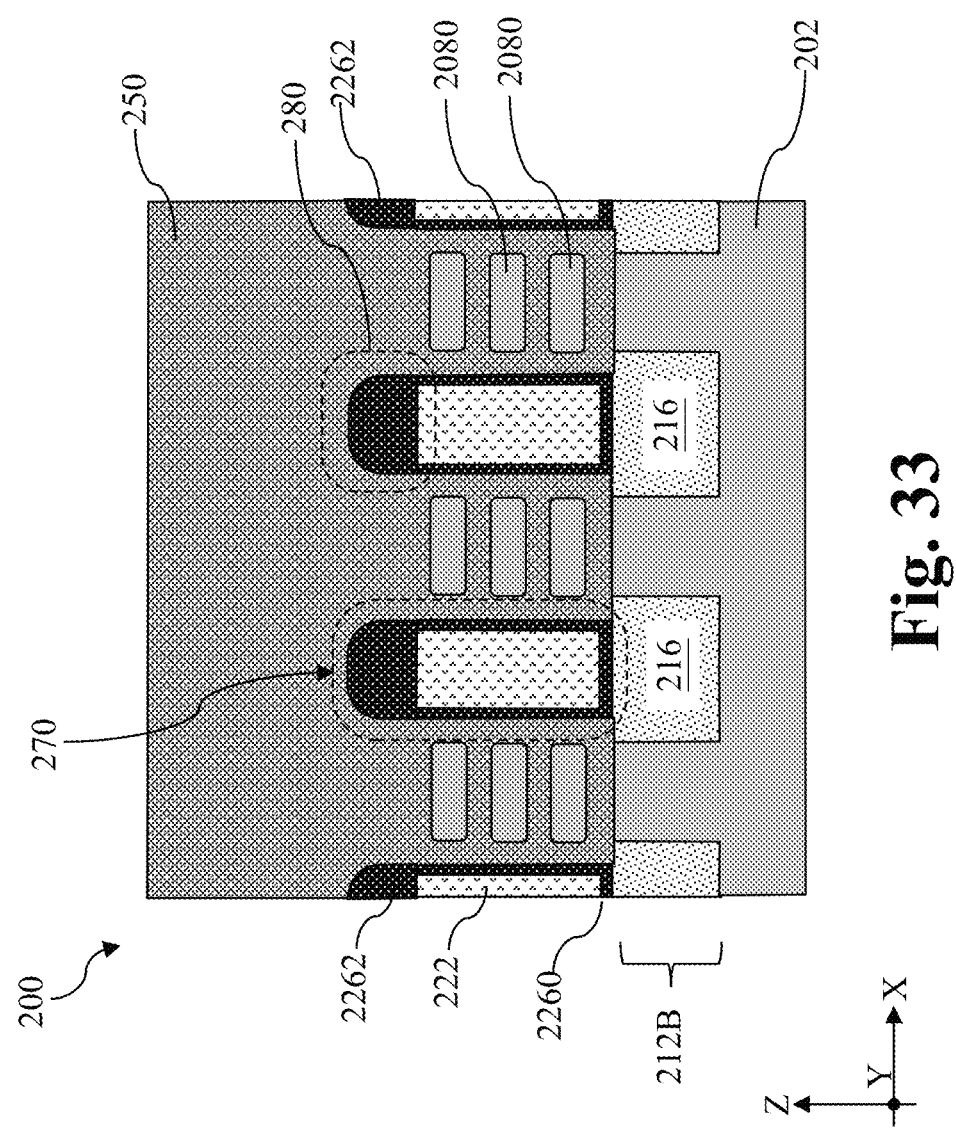

Referring to FIGS. 21, 32 and 33, method 300 includes a block 322 where a gate structure 250 is formed. Operations at block 322 include deposition of a contact etch stop layer (CESL) 242 and an interlayer dielectric (ILD) layer 244 over the source/drain features 240 (shown in FIG. 32), removal of the dummy gate stack 230, selective removal of the sacrificial layers 206 to release the channel layers 208 as channel members 2080 (shown in FIG. 33), and formation of the gate structure 250 to wrap around each of the channel members 2080 (shown in FIG. 33). The CESL 242 and the ILD layer 244 are deposited over the source/drain features 240 to protect the same from subsequent processes. The CESL 242 may include silicon nitride and may be deposited on the source/drain features 240 and surfaces of the helmet features 280 using ALD or CVD. The ILD layer 244 includes materials such as tetraethylorthosilicate (TEOS) oxide, undoped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 244 may be deposited on the CESL 242 by spin-on coating, an FCVD process, or other suitable deposition technique. After the deposition of the CESL 242 and the ILD layer 244, a planarization process (such a CMP process) may be performed to the workpiece 200 to provide a planar top surface that exposes the dummy gate stack 230. As shown in FIG. 32, the CESL 242 is in direct contact with the shielding dielectric layer 2260 and the helmet dielectric layer 2262 in the helmet features 280.

While not explicitly shown, the exposed dummy gate stack 230 is then removed from the workpiece 200 by a selective etch process. The selective etch process may be a selective wet etch process, a selective dry etch process, or a combination thereof. In the depicted embodiments, the selective etch process selectively removes the dummy dielectric layer and the dummy electrode without substantially damaging the second dielectric fins 270 in the channel regions. The removal of the dummy gate stack 230 results in a gate trench over the channel regions. The gate trenches are defined by the at least one gate spacer 232.

After the removal of the dummy gate stack 230, sacrificial layers 206 and the cladding layers 218 in the channel region may be selectively removed to release the channel layers 208 to form channel members 2080, shown in FIG. 33. Each of the channel members 2080 extends lengthwise along the Y direction between two source/drain features 240. As shown in FIG. 33, a vertical stack of the channel members 2080 is disposed directly over each of the base portion 212B. The selective removal of the sacrificial layers 206 and the cladding layer 218 may be implemented by selective dry etch, selective wet etch, or other selective etch processes. In some embodiments, the selective wet etching includes an APM etch (e.g., ammonia hydroxide-hydrogen peroxide-water mixture). In some alternative embodiments, the selective removal includes silicon germanium oxidation followed by a silicon germanium oxide removal. For example, the oxidation may be provided by ozone clean and then silicon germanium oxide removed by an etchant such as NH$_4$OH.

Referring still to FIG. 33, the gate structure 250 is then formed to wrap around each of the channel members 2080. While not explicitly shown in the figure, the gate structure 250 may include an interfacial layer on the channel members 2080 and the base portions 212B, a gate dielectric layer over the interfacial layer, and a gate electrode layer over the gate dielectric layer. In some embodiments, the interfacial layer includes silicon oxide and may be formed as result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed surfaces of the channel members 2080 and the base portions 212B to form the interfacial layer. The gate dielectric layer is then deposited over the interfacial layer using ALD, CVD, and/or other suitable methods. The gate dielectric layer may include high-K dielectric materials. As used herein, high-k dielectric materials include dielectric materials having a high dielectric constant, for example, greater than that of thermal silicon oxide (~3.9). In one embodiment, the gate dielectric layer may include hafnium oxide. Alternatively, the gate dielectric layer may include other high-K dielectrics, such as titanium oxide (TiO$_2$), hafnium zirconium oxide (HfZrO), tantalum oxide (Ta$_2$O$_5$), hafnium silicon oxide (HfSiO$_4$), zirconium oxide (ZrO$_2$), zirconium silicon oxide (ZrSiO$_2$), lanthanum oxide (La$_2$O$_3$), aluminum oxide (Al$_2$O$_3$), zirconium oxide (ZrO), yttrium oxide (Y$_2$O$_3$), SrTiO$_3$ (STO), BaTiO$_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)TiO$_3$ (BST), silicon nitride (SiN), silicon oxynitride (SiON), combinations thereof, or other suitable material. It is noted that the rounded helmet features 280 provide a larger unhindered opening that facilitates the channel release process and the formation of the gate structure 250.

After the formation or deposition of the interfacial layer and the gate dielectric layer, a gate electrode layer is deposited over the gate dielectric layer. The gate electrode layer may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer may be formed by ALD, PVD, CVD, e-beam evaporation, or other suitable process.

While the gate structure 250 is shown in FIG. 33 as engaging multiple stack of channel members 2080, a subsequent planarization process, such as a CMP process, may be performed until the gate structure 250 is divided at least in part by the second dielectric fins 270 into segments. In some implementations, additional gate cut dielectric features may also be formed directly over one or more of the second dielectric fins 270 to divide the gate structure 250 into different segments.

Figure 34:
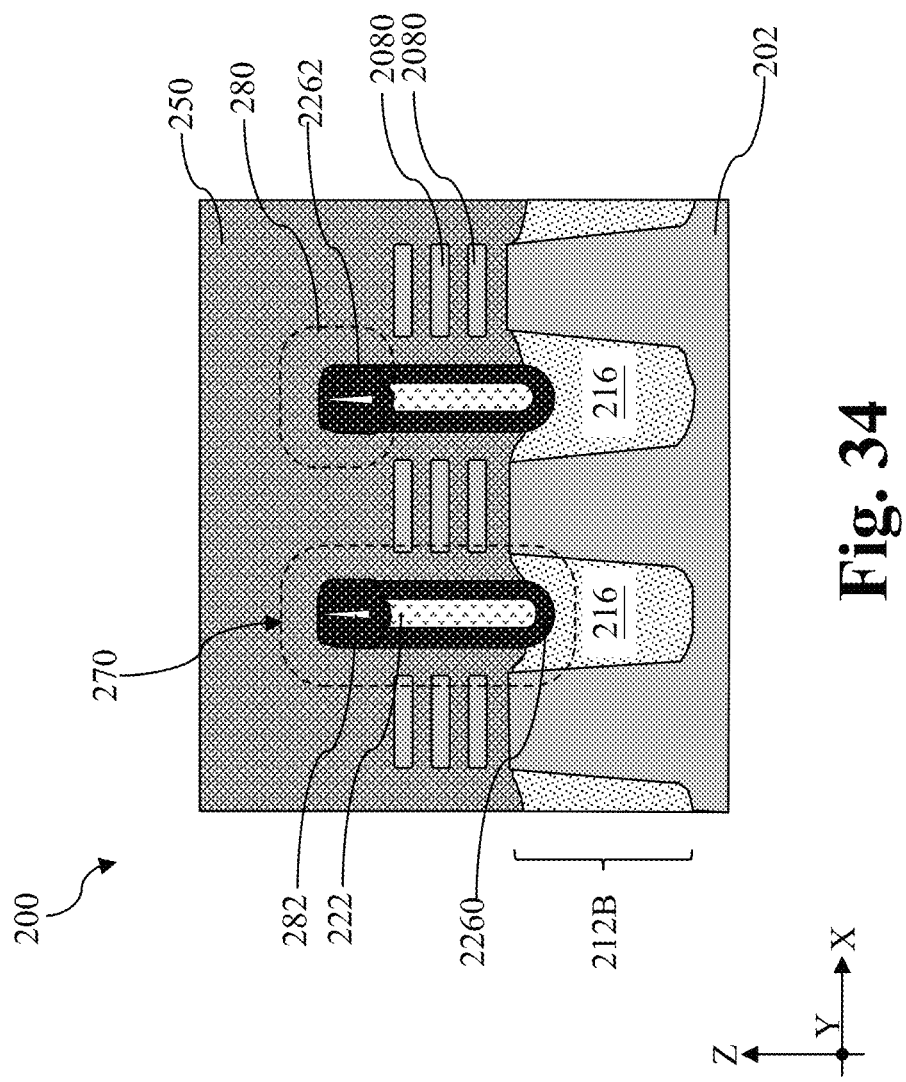

When the operations in method 300 are performed in an less-than-ideal manner, the semiconductor structure 200 shown in FIG. 34 may be resulted. As depicted in FIG. 34, instead of having a substantially planar top surface, the isolation feature 216 may include a valley-like recess where a center point of the isolation feature 216 may be the lowest. Instead of having square edges, each of the second dielectric fins 270 has a rounded bottom and top edges. The etching back at block 312 may also form a valley-like recess in the second dielectric layer 222. The valley-like recess in the second dielectric layer 222 allows a bottom portion of the helmet dielectric layer 2262 to partially extend into the second dielectric layer 222. Because the helmet dielectric layer 2262 is conformally deposited at block 314 and the helmet dielectric layer 2262 may merge to close opening, the helmet dielectric layer 2262 may include a center seam or center slit.

In one exemplary aspect, the present disclosure is directed to a semiconductor structure. The semiconductor structure includes a base fin over a substrate and extending lengthwise along a first direction, a stack of nanostructures disposed directly over the base fin, a gate structure wrapping around each of the stack of nanostructures, an isolation feature disposed over the substrate and adjacent the base fin along a second direction perpendicular to the first direction, and a dielectric fin disposed directly on the isolation feature. The dielectric fin includes a bottom portion, a middle layer over the bottom portion, and a top layer over the middle layer. The bottom portion includes an outer layer in contact with the isolation feature and the gate structure and an inner layer spaced apart from the gate structure and the isolation feature by the outer layer. The middle layer is in direct contact with top surfaces of the inner layer and the outer layer. A dielectric constant of the top layer is greater than a dielectric constant of the middle layer.

In some embodiments, the top layer is spaced apart from the inner layer or the outer layer by the middle layer. In some implementations, the outer layer includes silicon carbonitride or silicon nitride and the inner layer includes silicon oxide. In some implementations, the inner layer and the isolation feature are formed of the same material. In some instances, the middle layer includes silicon oxide. In some embodiments, the top layer includes hafnium oxide, ruthenium oxide, lanthanum oxide, rhenium oxide, aluminum oxide, or zirconium oxide. In some embodiments, the semiconductor structure further includes a source/drain feature coupled to sidewalls of the stack of nanostructures along the first direction, and a dielectric layer disposed over the source/drain feature. The dielectric fin includes a first region under the gate structure and a second region under the dielectric layer. In some instances, the semiconductor structure further includes a contact etch stop layer (CESL) extending between the second region of the dielectric fin and the dielectric layer and the CESL is in direct contact with the middle layer and the top layer. In some embodiments, the CESL includes silicon nitride.

In another exemplary aspect, the present disclosure is directed to a semiconductor structure. The semiconductor structure includes a base fin over a substrate and extending lengthwise along a first direction; a plurality of channel members disposed directly over the base fin, a gate structure wrapping around each of the plurality of channel members, an isolation feature disposed over the substrate and adjacent the base fin along a second direction perpendicular to the first direction, and a dielectric fin disposed directly on the isolation feature. The dielectric fin includes a bottom portion and a helmet feature over the bottom portion. The bottom portion includes an outer layer in contact with the isolation feature and the gate structure and an inner layer spaced apart from the gate structure and the isolation feature by the outer layer. A composition of the outer layer is the same as a composition of the helmet feature.

In some embodiments, the helmet feature is in direct contact with the inner layer and the outer layer. In some implementations, the outer layer includes hafnium oxide, ruthenium oxide, lanthanum oxide, rhenium oxide, aluminum oxide, or zirconium oxide and the inner layer includes silicon oxide. In some embodiments, the inner layer and the isolation feature are formed of the same material. In some instances, a portion of the gate structure is in direct contact with the isolation feature. In some embodiments, the semiconductor structure further includes a source/drain feature coupled to sidewalls of the plurality of channel members along the first direction, and a dielectric layer disposed over the source/drain feature. The dielectric fin includes a first region under the gate structure and a second region under the dielectric layer. In some embodiments, the semiconductor structure further includes a contact etch stop layer (CESL) extending between the second region of the dielectric fin and the dielectric layer. The CESL is in direct contact with the helmet feature. In some implementations, the CESL includes silicon nitride.

In yet another exemplary aspect, the present disclosure is directed to a method. The method includes forming a stack of epitaxial layers over a substrate, forming a first fin-like structure and a second fin-like structure such that each of the first fin-like structure and the second fin-like structure includes a base portion formed of the substrate and a top portion formed of the stack, forming an isolation feature between the base portion of first fin-like structure and the base portion of the second fin-like structure, forming a cladding layer over surfaces of the top portions of the first fin-like structure and the second fin-like structure, conformally depositing a first dielectric layer over the cladding layer and the isolation feature, depositing a second dielectric layer over the first dielectric layer, selectively etching back the first dielectric layer and the second dielectric layer to form a first recess, conformally depositing a third dielectric layer over the first recess, depositing a fourth dielectric layer over the third dielectric layer, selectively pulling back the third dielectric layer and the fourth dielectric layer to form a second recess, depositing a fifth dielectric layer over the second recess, and after the depositing of the fifth dielectric layer, planarizing the fifth dielectric layer to expose a top surface of the cladding layer in a planar top surface.

In some embodiments, the cladding layer includes silicon germanium and the forming of the cladding layer includes an epitaxial deposition process. In some embodiments, the third dielectric layer includes silicon oxide.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a base fin over a substrate and extending lengthwise along a first direction;
   a stack of nanostructures disposed directly over the base fin;
   a gate structure wrapping around each of the stack of nanostructures;
   an isolation feature disposed over the substrate and adjacent the base fin along a second direction perpendicular to the first direction; and
   a dielectric fin disposed directly on the isolation feature,
   wherein the dielectric fin comprises a bottom portion, a middle layer over the bottom portion, and a top layer over the middle layer,
   wherein the bottom portion comprises an outer layer in contact with the isolation feature and the gate structure and an inner layer spaced apart from the gate structure and the isolation feature by the outer layer,
   wherein the middle layer is in direct contact with top surfaces of the inner layer and the outer layer,
   wherein a dielectric constant of the top layer is greater than a dielectric constant of the middle layer.

2. The semiconductor structure of claim 1, wherein the top layer is spaced apart from the inner layer or the outer layer by the middle layer.

3. The semiconductor structure of claim 1,
wherein the outer layer comprises silicon carbonitride or silicon nitride,
wherein the inner layer comprises silicon oxide.

4. The semiconductor structure of claim 1, wherein the inner layer and the isolation feature are formed of the same material.

5. The semiconductor structure of claim 1, wherein the middle layer comprises silicon oxide.

6. The semiconductor structure of claim 1, wherein the top layer comprises hafnium oxide, ruthenium oxide, lanthanum oxide, rhenium oxide, aluminum oxide, or zirconium oxide.

7. The semiconductor structure of claim 1, further comprising:
a source/drain feature coupled to sidewalls of the stack of nanostructures along the first direction; and
a dielectric layer disposed over the source/drain feature,
wherein the dielectric fin comprises a first region under the gate structure and a second region under the dielectric layer.

8. The semiconductor structure of claim 7, further comprising:
a contact etch stop layer (CESL) extending between the second region of the dielectric fin and the dielectric layer,
wherein the CESL is in direct contact with the middle layer and the top layer.

9. The semiconductor structure of claim 8, wherein the CESL comprises silicon nitride.

10. A semiconductor structure, comprising:
a base fin over a substrate and extending lengthwise along a first direction;
a plurality of channel members disposed directly over the base fin;
a gate structure wrapping around each of the plurality of channel members;
an isolation feature disposed over the substrate and adjacent the base fin along a second direction perpendicular to the first direction; and
a dielectric fin disposed directly on the isolation feature,
wherein the dielectric fin comprises a bottom portion and a helmet feature over the bottom portion,
wherein the bottom portion comprises an outer layer in contact with the isolation feature and the gate structure and an inner layer spaced apart from the gate structure and the isolation feature by the outer layer,
wherein a composition of the outer layer is the same as a composition of the helmet feature,
wherein the helmet feature is in direct contact with top surfaces the inner layer and the outer layer.

11. The semiconductor structure of claim 10,
wherein the outer layer comprises hafnium oxide, ruthenium oxide, lanthanum oxide, rhenium oxide, aluminum oxide, or zirconium oxide,
wherein the inner layer comprises silicon oxide.

12. The semiconductor structure of claim 10, wherein the inner layer and the isolation feature are formed of the same material.

13. The semiconductor structure of claim 10, wherein a portion of the gate structure is in direct contact with the isolation feature.

14. The semiconductor structure of claim 10, further comprising:
a source/drain feature coupled to sidewalls of the plurality of channel members along the first direction; and
a dielectric layer disposed over the source/drain feature,
wherein the dielectric fin comprises a first region under the gate structure and a second region under the dielectric layer.

15. The semiconductor structure of claim 14, further comprising:
a contact etch stop layer (CESL) extending between the second region of the dielectric fin and the dielectric layer,
wherein the CESL is in direct contact with the helmet feature.

16. The semiconductor structure of claim 15, wherein the CESL comprises silicon nitride.

17. The semiconductor structure of claim 10, wherein the helmet feature comprises a center seam.

18. A semiconductor structure, comprising:
a first base fin and a second base fin extending from a substrate;
an isolation feature disposed over the substrate and sandwiched between the first base fin and the second base fin;
a first source/drain feature over the first base fin;
a second source/drain feature over the second base fin; and
a dielectric fin disposed over the isolation feature and sandwiched between the first source/drain feature and the second source/drain feature,
wherein the dielectric fin comprises a bottom portion, a middle layer over the bottom portion, and a top layer over the middle layer,
wherein the bottom portion comprises an outer layer in contact with the first source/drain feature and the second source/drain feature and an inner layer spaced apart from the first source/drain feature and the second source/drain feature by the outer layer,
wherein the middle layer is in direct contact with top surfaces of the inner layer and the outer layer,
wherein a dielectric constant of the top layer is greater than a dielectric constant of the middle layer.

19. The semiconductor structure of claim 18, wherein the middle layer comprises silicon oxide.

20. The semiconductor structure of claim 18, wherein the top layer comprises hafnium oxide, ruthenium oxide, lanthanum oxide, rhenium oxide, aluminum oxide, or zirconium oxide.

* * * * *